(12) United States Patent  
Inoue et al.

(10) Patent No.: US 12,100,688 B2  
(45) Date of Patent: Sep. 24, 2024

(54) SEMICONDUCTOR DEVICE

(71) Applicant: ROHM CO., LTD., Kyoto (JP)

(72) Inventors: Kaito Inoue, Kyoto (JP); Akihiro Kimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 357 days.

(21) Appl. No.: 17/607,346

(22) PCT Filed: May 12, 2020

(86) PCT No.: PCT/JP2020/018953  
§ 371 (c)(1),  
(2) Date: Oct. 28, 2021

(87) PCT Pub. No.: WO2020/241238  
PCT Pub. Date: Dec. 3, 2020

(65) Prior Publication Data  
US 2022/0223568 A1    Jul. 14, 2022

(30) Foreign Application Priority Data  
May 27, 2019 (JP) .................................. 2019-098550

(51) Int. Cl.  
*H01L 25/07* (2006.01)  
*H01L 23/00* (2006.01)  
*H01L 23/373* (2006.01)  
(Continued)

(52) U.S. Cl.  
CPC ........ *H01L 25/072* (2013.01); *H01L 23/3735* (2013.01); *H01L 23/4924* (2013.01);  
(Continued)

(58) Field of Classification Search  
CPC ... H01L 25/072; H01L 25/18; H01L 23/3735; H01L 23/4924; H01L 23/492;  
(Continued)

(56) References Cited

U.S. PATENT DOCUMENTS 5,134,463 A * 7/1992 Yamaguchi ......... H01L 23/4924  
                                                     257/E23.109  
2012/0306086 A1* 12/2012 Sugimura ............... H01L 23/24  
                                                     257/762  
(Continued)

FOREIGN PATENT DOCUMENTS

JP    2007-115731 A    5/2007  
JP    2008-294390 A    12/2008  
(Continued)

OTHER PUBLICATIONS

Search Report issued in PCT/JP2020/018953, Jul. 21, 2020 (2 pages).  
Office Action received in the corresponding Japanese Patent application, Aug. 29, 2023, and machine translation (5 pages).

*Primary Examiner* — Shaun M Campbell  
*Assistant Examiner* — Teresa M. Arroyo  
(74) *Attorney, Agent, or Firm* — HSML P.C.

(57) ABSTRACT

The semiconductor device A1 includes a support member 2, a metal part 30 having obverse and reverse surfaces 301-302 spaced in z direction, with the reverse surface 302 bonded to the support member 2, a second bonding layer 42 boding the support member 2 and the metal part 30, a semiconductor element 10 facing the obverse surface 301 and bonded to the metal part 30, and a sealing member 7 covering the support member 2, metal part 30, second bonding layer 42 and semiconductor element 10. The metal part 30 includes a first body 31 of a first material and a second body 32 of a second material, with a boundary between the bodies 31-32. The second material has a linear thermal expansion coefficient smaller than that of the first material. The semiconductor device is improved in reliability by reducing thermal stress from heat generation of the semiconductor element.

16 Claims, 15 Drawing Sheets

(51) Int. Cl.
*H01L 23/492* (2006.01)
(52) U.S. Cl.
CPC .... *H01L 24/48* (2013.01); *H01L 2224/48091* (2013.01); *H01L 2224/48247* (2013.01); *H01L 2224/73265* (2013.01); *H01L 2924/18165* (2013.01)
(58) Field of Classification Search
CPC ......... H01L 23/49555; H01L 23/49531; H01L 23/49562; H01L 23/49575; H01L 24/48; H01L 2224/48091; H01L 2224/48247; H01L 2224/73265; H01L 2224/0603; H01L 2224/4903; H01L 2224/49111; H01L 2924/18165; H01L 2924/19107
See application file for complete search history.

(56) References Cited

U.S. PATENT DOCUMENTS

| | | | |
|---|---|---|---|
| 2017/0338176 A1* | 11/2017 | Tsuyuno | H01L 25/072 |
| 2018/0005914 A1* | 1/2018 | Ogawa | H05K 1/05 |
| 2018/0277506 A1* | 9/2018 | Watanabe | H01L 23/3735 |
| 2019/0006258 A1* | 1/2019 | Muto | H01L 23/4006 |
| 2022/0189904 A1* | 6/2022 | Otsuka | H01L 23/473 |

FOREIGN PATENT DOCUMENTS

| | | |
|---|---|---|
| JP | 2013-149912 A | 8/2013 |
| JP | 2019-12767 A | 1/2019 |
| JP | 2019-29631 A | 2/2019 |

* cited by examiner

SEMICONDUCTOR DEVICE

TECHNICAL FIELD

The present disclosure relates to semiconductor devices provided with semiconductor elements.

BACKGROUND ART

Semiconductor devices with mounted semiconductor elements are known, such as a MOSFET (Metal-Oxide-Semiconductor Field-Effect Transistor) or an IGBT (Insulated Gate Bipolar Transistor). Patent Document 1 discloses an example of such a semiconductor device with a mounted semiconductor element. The semiconductor device disclosed in Patent Document 1 includes a semiconductor element, a support member, a heat dissipator plate and a sealing member. The semiconductor element is bonded to the heat dissipator plate with solder. The support member includes an electrically conductive pattern, a metal plate and an insulating resin. In the support member, the insulating resin (which may contain a ceramic material) is formed the upper surface of the metal plate (made of a metal such as aluminum or copper, or an alloy of such metals), and the conductive pattern (made of a metal such as aluminum or copper, or an alloy of such metals) is formed on the insulating resin. The heat dissipator plate is a plate member made of copper or copper alloy, for example. The heat dissipator plate is bonded to the conductive pattern of the support member with solder. The sealing member covers the semiconductor element, portions of the support member, the heat dissipator plate and solder.

TECHNICAL REFERENCE

Patent Document

Patent Document 1: JP-A-2008-294390

SUMMARY OF THE INVENTION

Problems to be Solved by the Invention

When electric power is supplied to a semiconductor device, heat is generated from the semiconductor element. With the temperature rise due to heat generation of the semiconductor element, the constituent members of the device thermally expand, exerting a thermal stress on the solder that bonds the heat dissipator plate and the support member, for example. Such a thermal stress may cause cohesive failure of the solder, which may result in a product failure such as poor joining or poor electrical conduction.

The present disclosure has been proposed under the above-noted circumstances, and an object of the present disclosure is to provide a semiconductor device that has an improved reliability by reducing thermal stress during heat generation by the semiconductor element.

Means for Solving the Problems

The semiconductor device of the present disclosure includes a support member, a metal part having a first obverse surface and a first reverse surface spaced apart from each other in a thickness direction, the first reverse surface facing the support member and being bonded to the support member, a bonding layer that bonds the support member and the metal part, a semiconductor element facing the first obverse surface and bonded to the metal part, and a sealing member that covers the support member, the metal part, the bonding layer and the semiconductor element. The metal part includes a first metal body made of a first metal material and a second metal body made of a second metal material, with a boundary existing between the first metal body and the second metal body. The second metal material has a coefficient of linear thermal expansion that is smaller than a coefficient of linear thermal expansion of the first metal material.

Advantages of the Invention

The semiconductor device according to the present disclosure reduces thermal stress during heat generation from a semiconductor element. Thus, the semiconductor device has an improved reliability.

MODE FOR CARRYING OUT THE INVENTION

Figure 1:
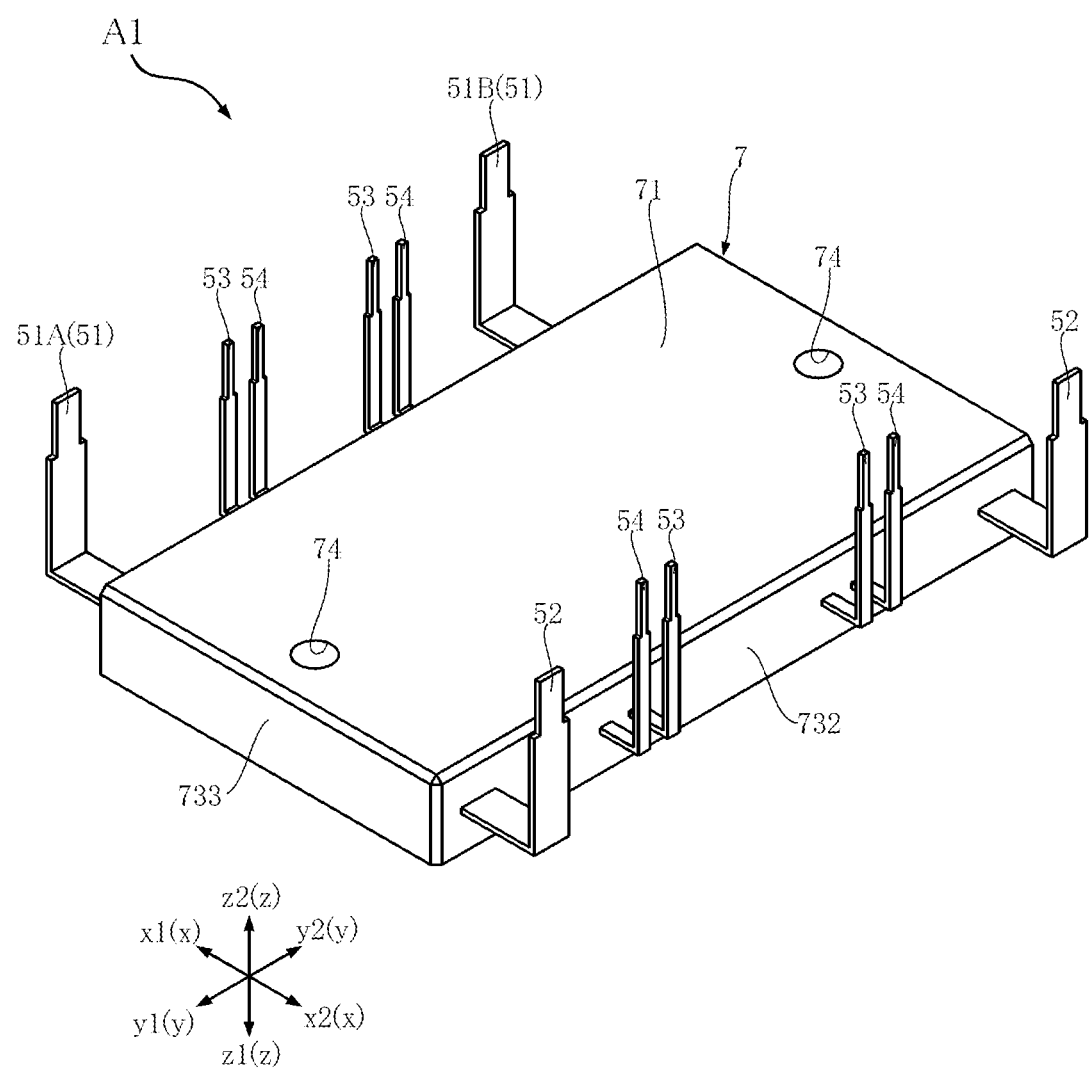
FIG. 1 is a perspective view showing a semiconductor device according to a first embodiment.

Preferred embodiments of the present disclosure are described below with reference to the accompanying drawings. Note that the same or similar elements are denoted by the same reference signs, and descriptions thereof will be omitted.

FIGS. 1-14 show a semiconductor device A1 according to a first embodiment. The semiconductor device A1 includes a plurality of semiconductor elements 10, a support member 2, a plurality of metal parts 30, a plurality of first bonding layers 41, a plurality of second bonding layers 42, a pair of input terminals 51, a pair of output terminals 52, a plurality of control terminals 53, a plurality of detection terminals 54, a plurality of connecting members 6 and a sealing member 7.

Figure 2:
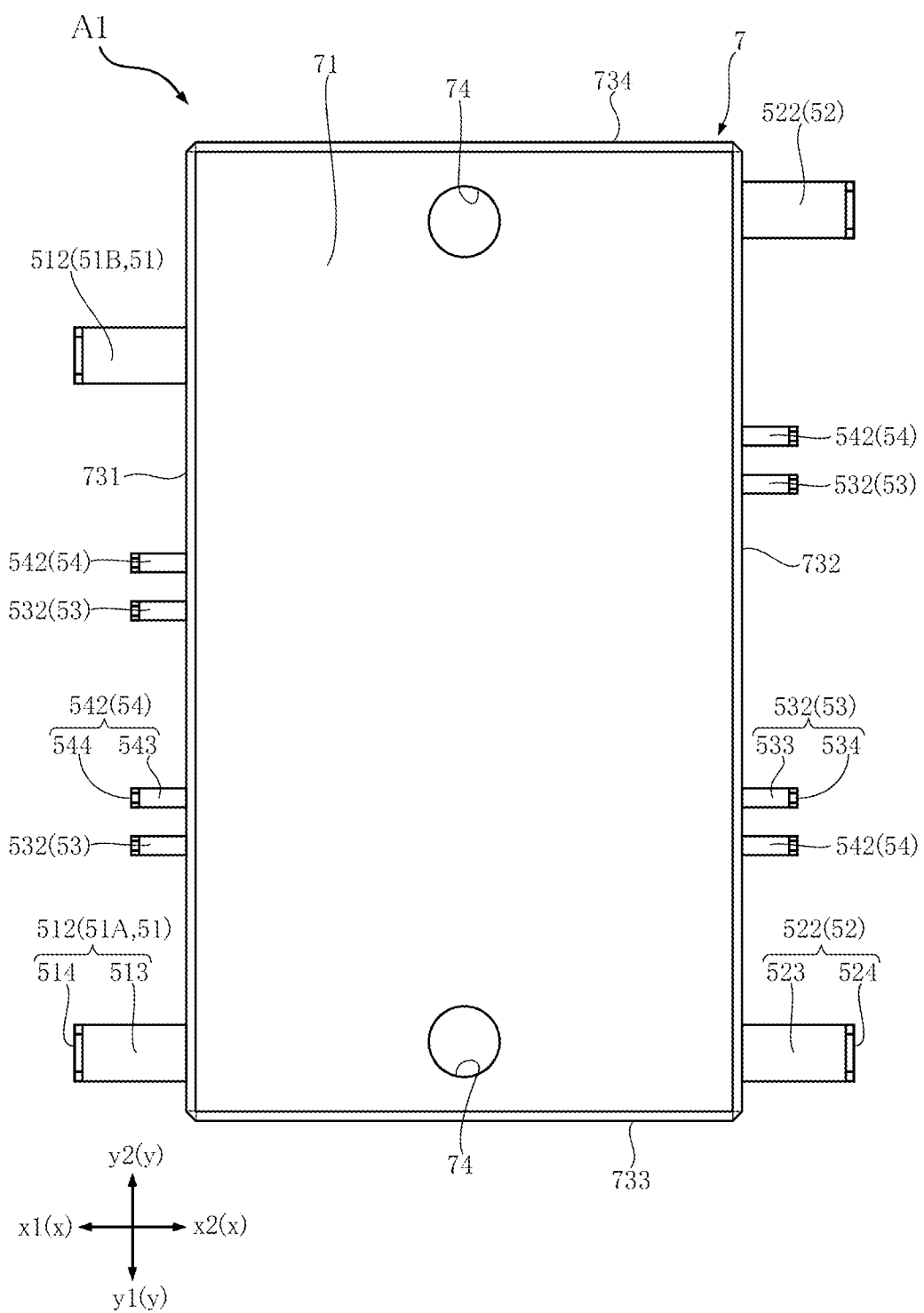
FIG. 2 is a plan view showing the semiconductor device according to the first embodiment.
Figure 3:
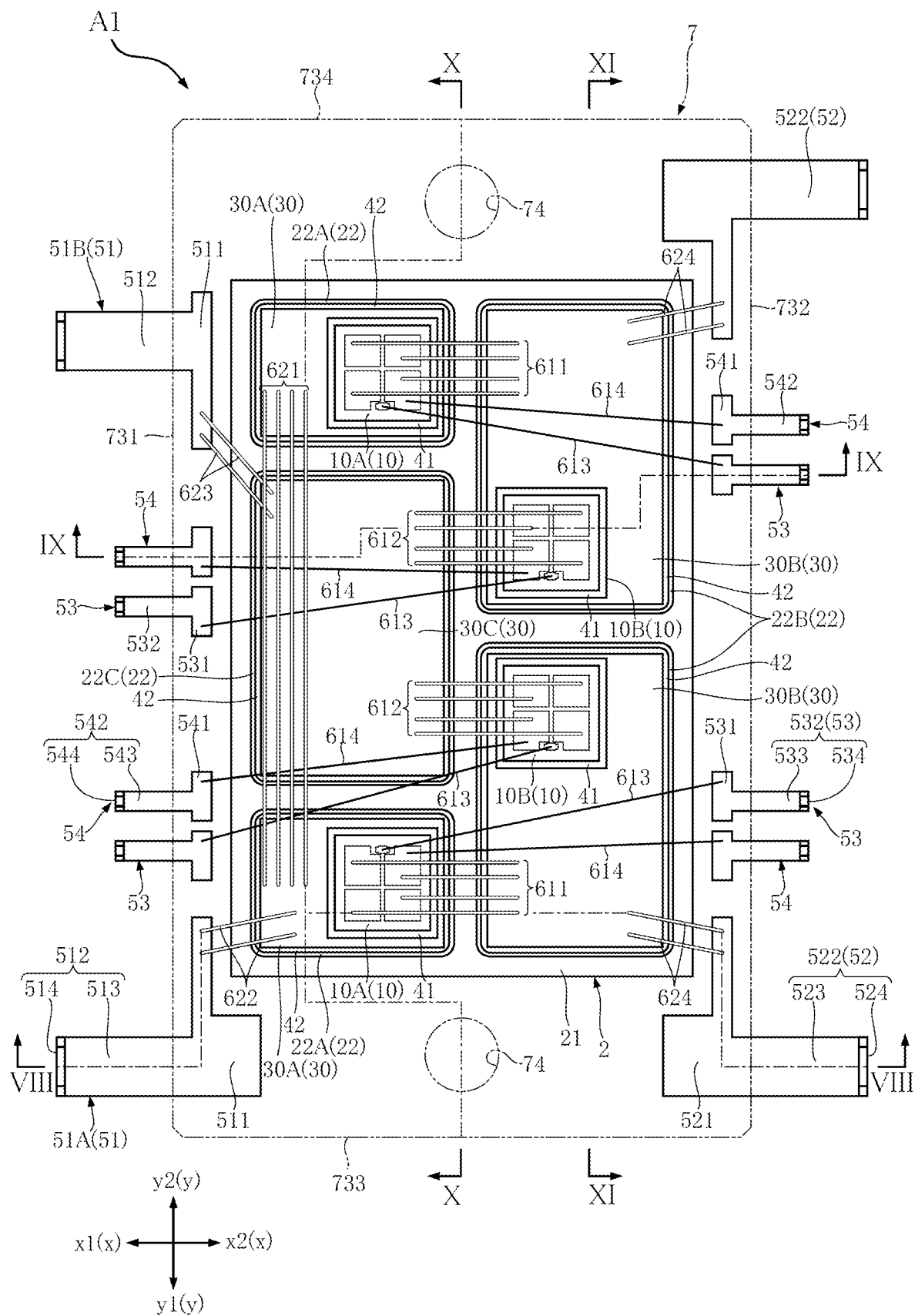
FIG. 3 is a view corresponding to the plan view of FIG. 2, with the sealing member 7 indicated by imaginary lines (two-dot chain lines).
Figure 4:
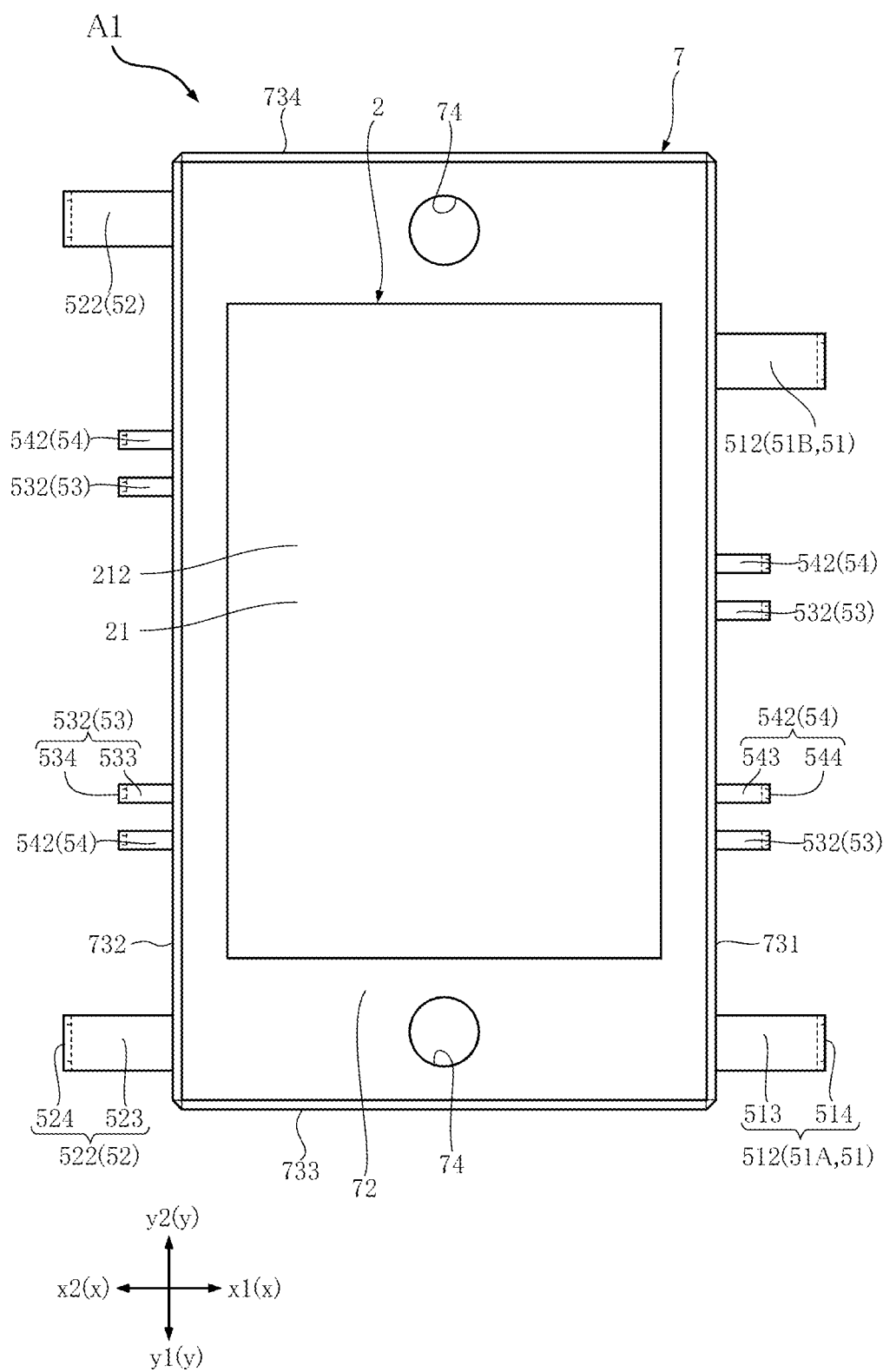
FIG. 4 is a bottom view showing the semiconductor device according to the first embodiment.
Figure 5:
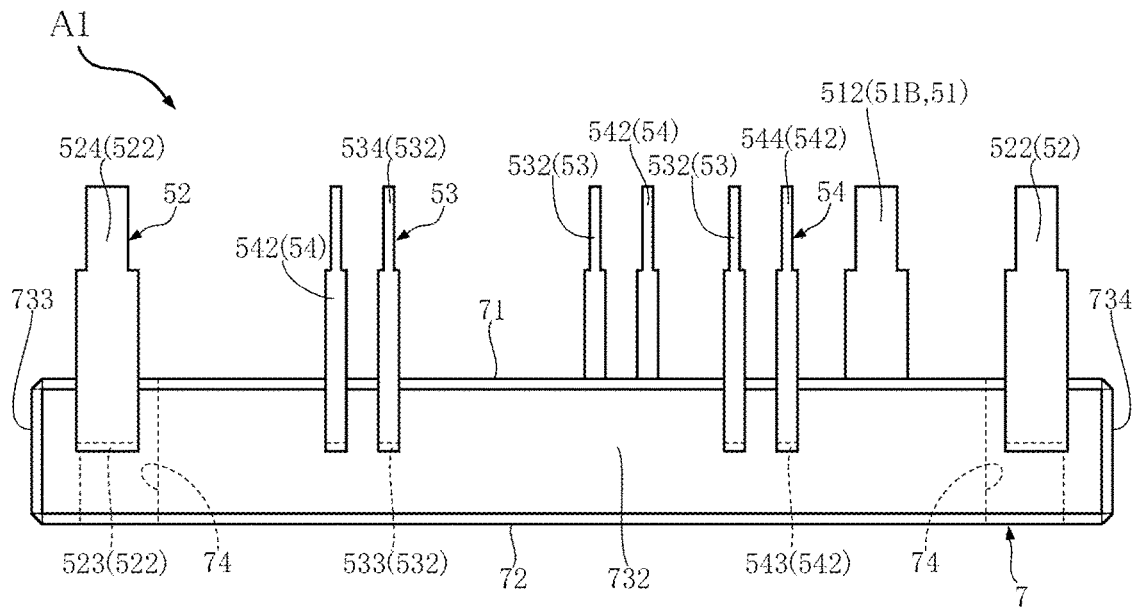
FIG. 5 is a side view (right-side view) showing the semiconductor device according to the first embodiment.
Figure 6:
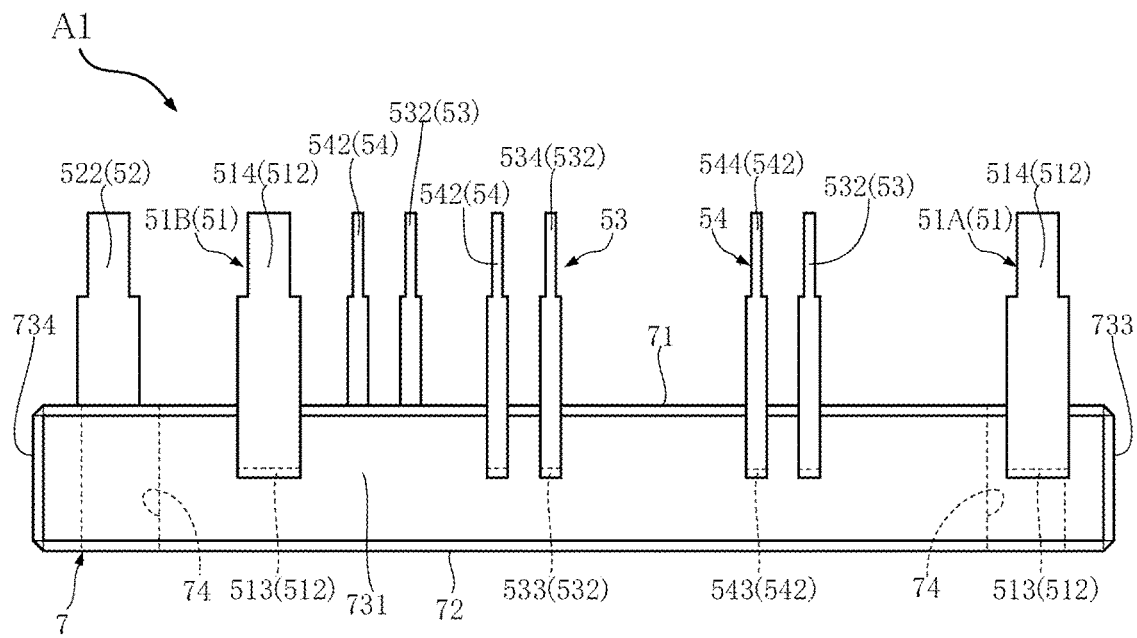
FIG. 6 is a side view (left-side view) showing the semiconductor device according to the first embodiment.
Figure 7:
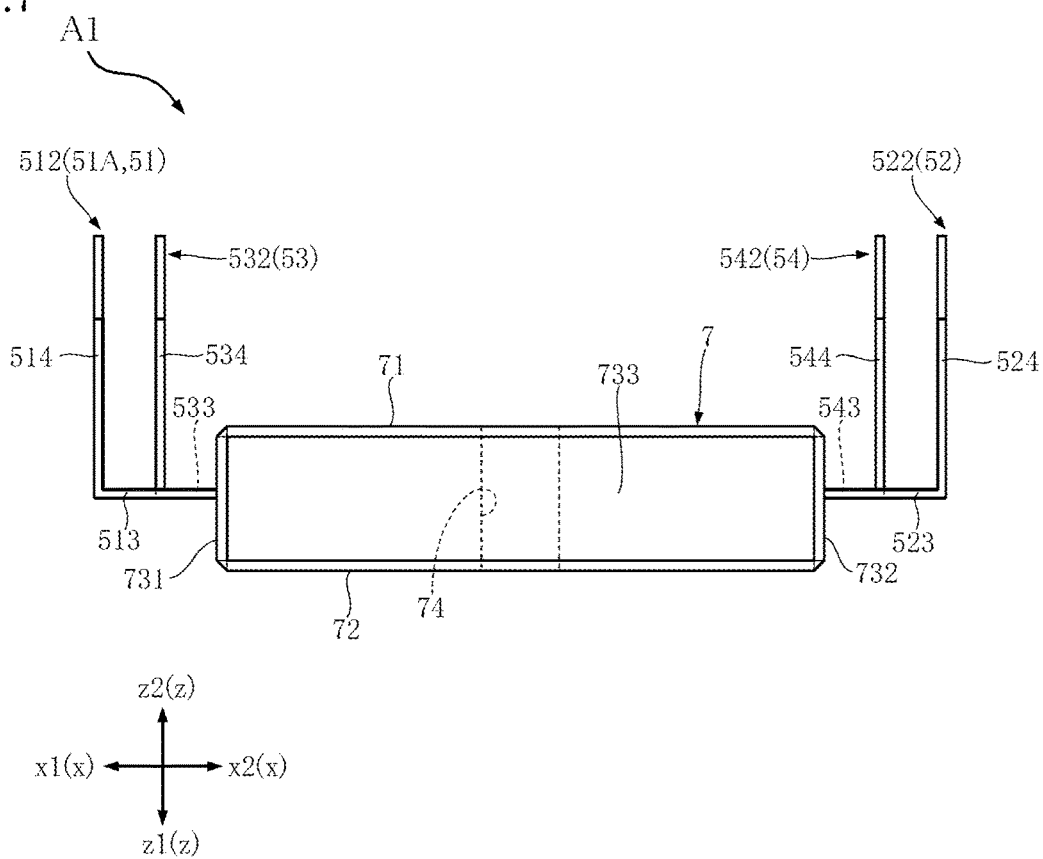
FIG. 7 is a front view showing the semiconductor device according to the first embodiment.
Figure 8:
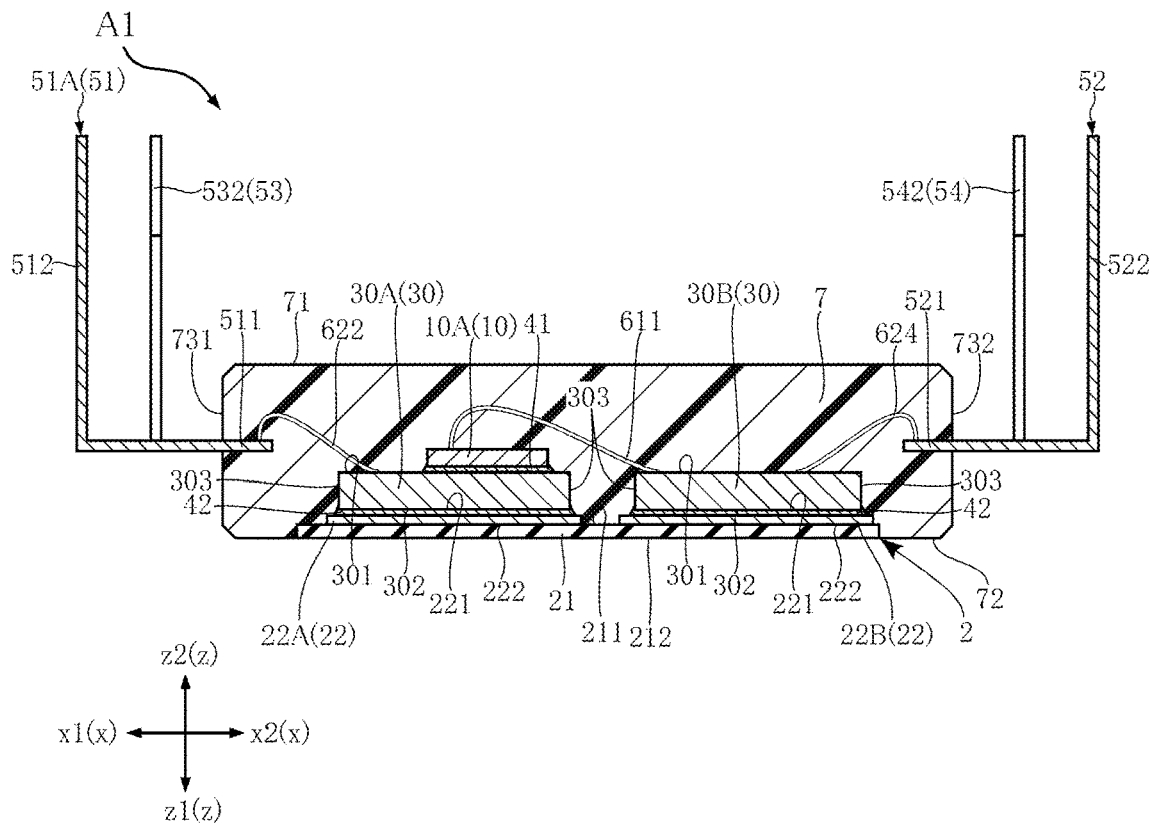
FIG. 8 is a sectional view taken along line VIII-VIII in FIG. 3.
Figure 9:
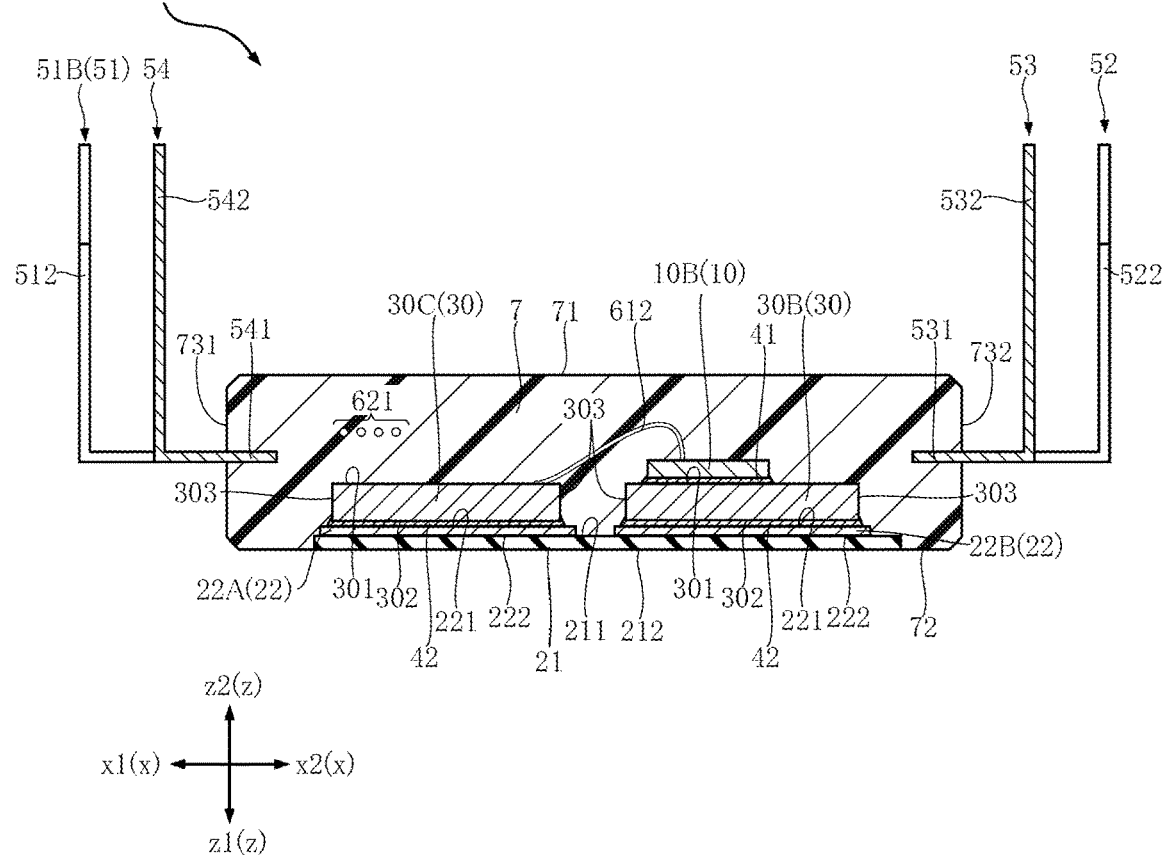
FIG. 9 is a sectional view taken along line IX-IX in FIG. 3.
Figure 10:
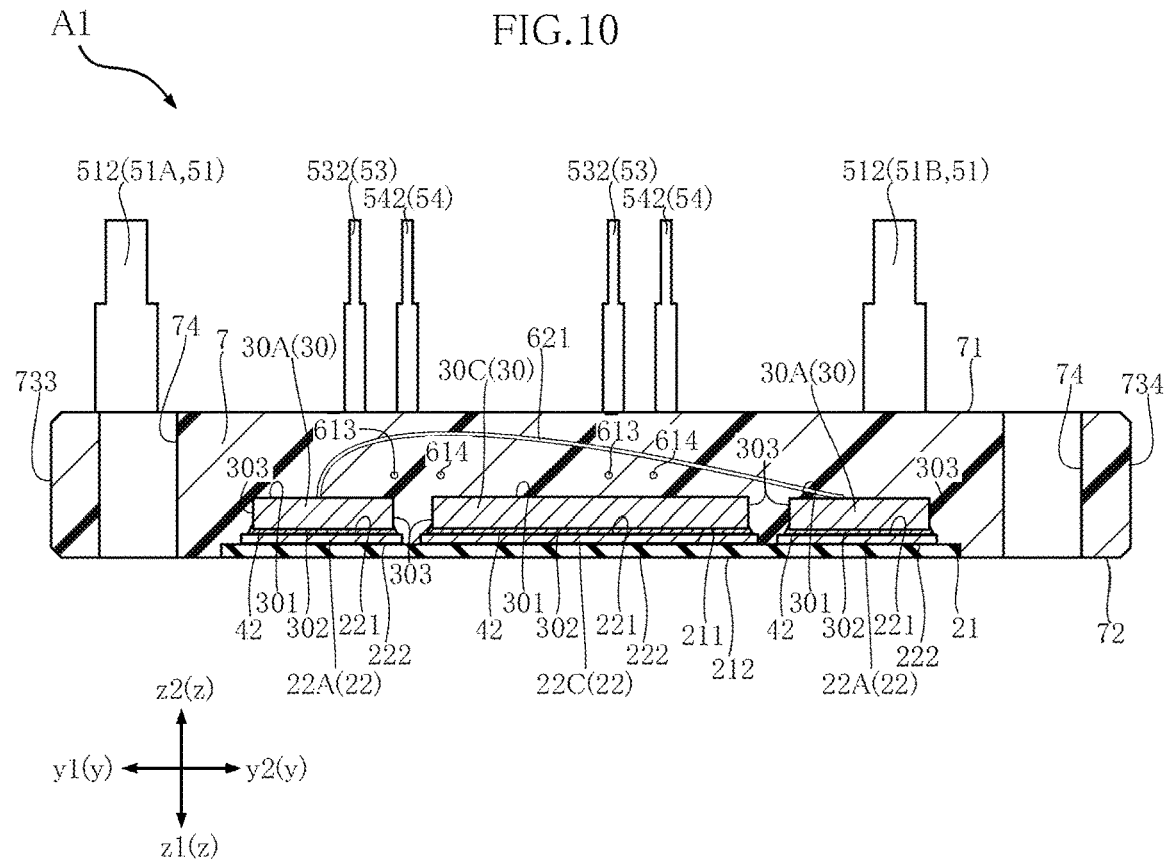
FIG. 10 is a sectional view taken along line X-X in FIG. 3.
Figure 11:
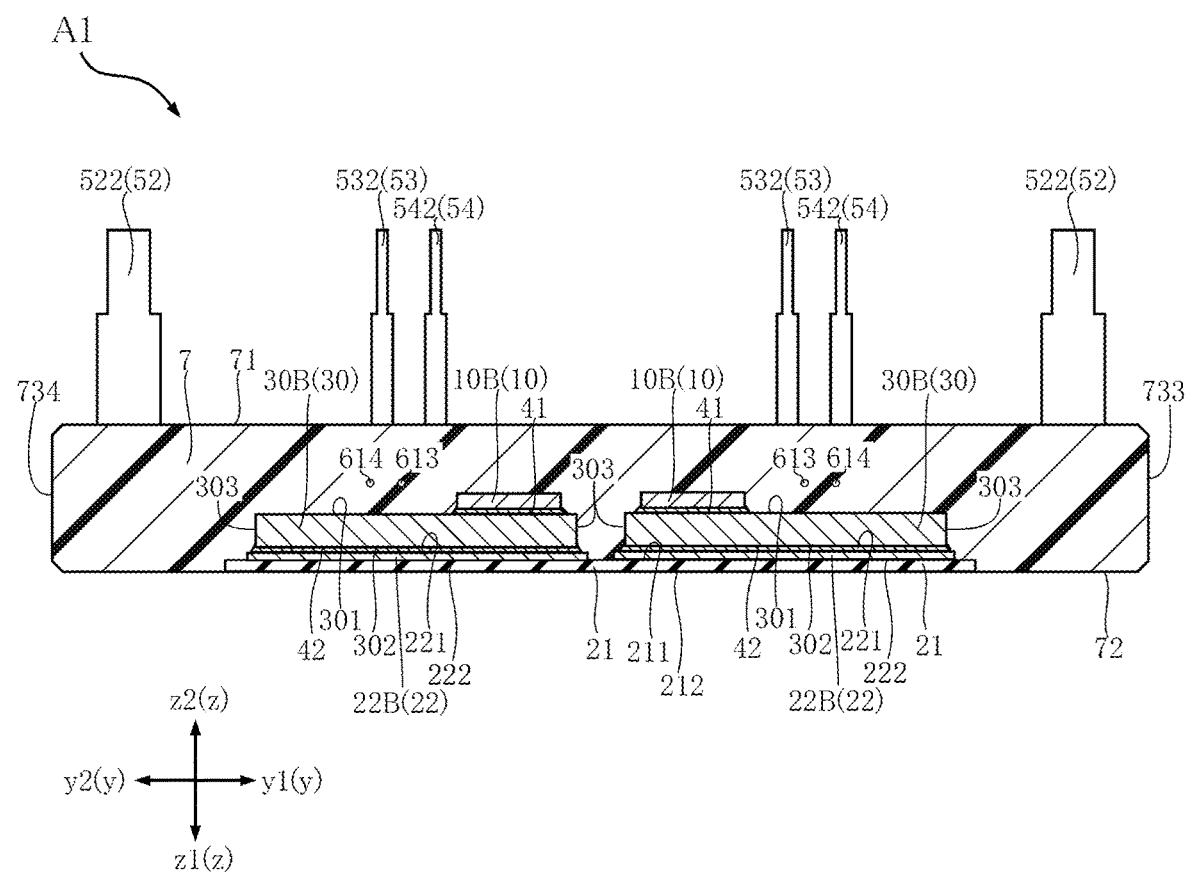
FIG. 11 is a sectional view taken along line XI-XI in FIG. 3.
Figure 12:
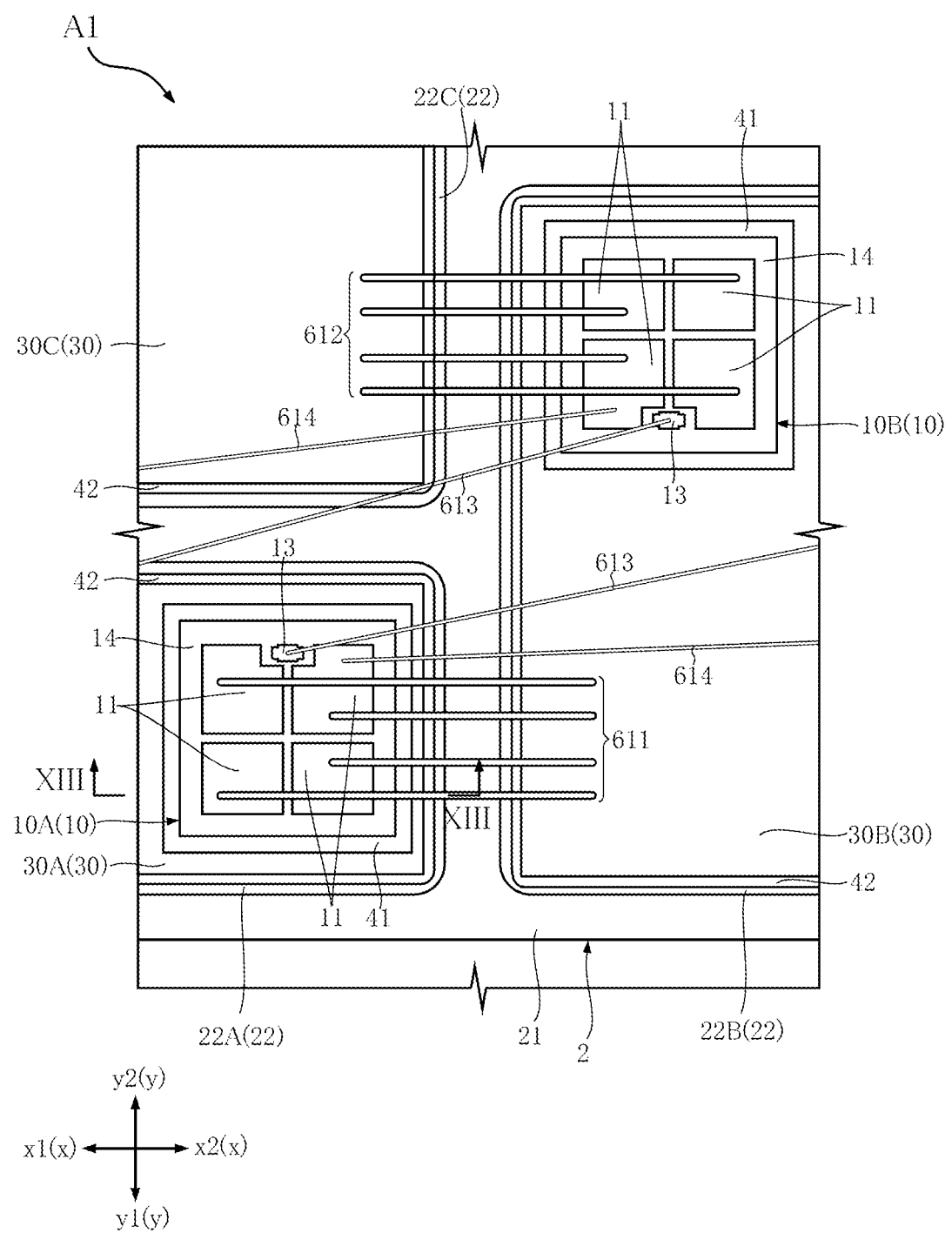
FIG. 12 is an enlarged view of a portion of FIG. 3.
Figure 13:
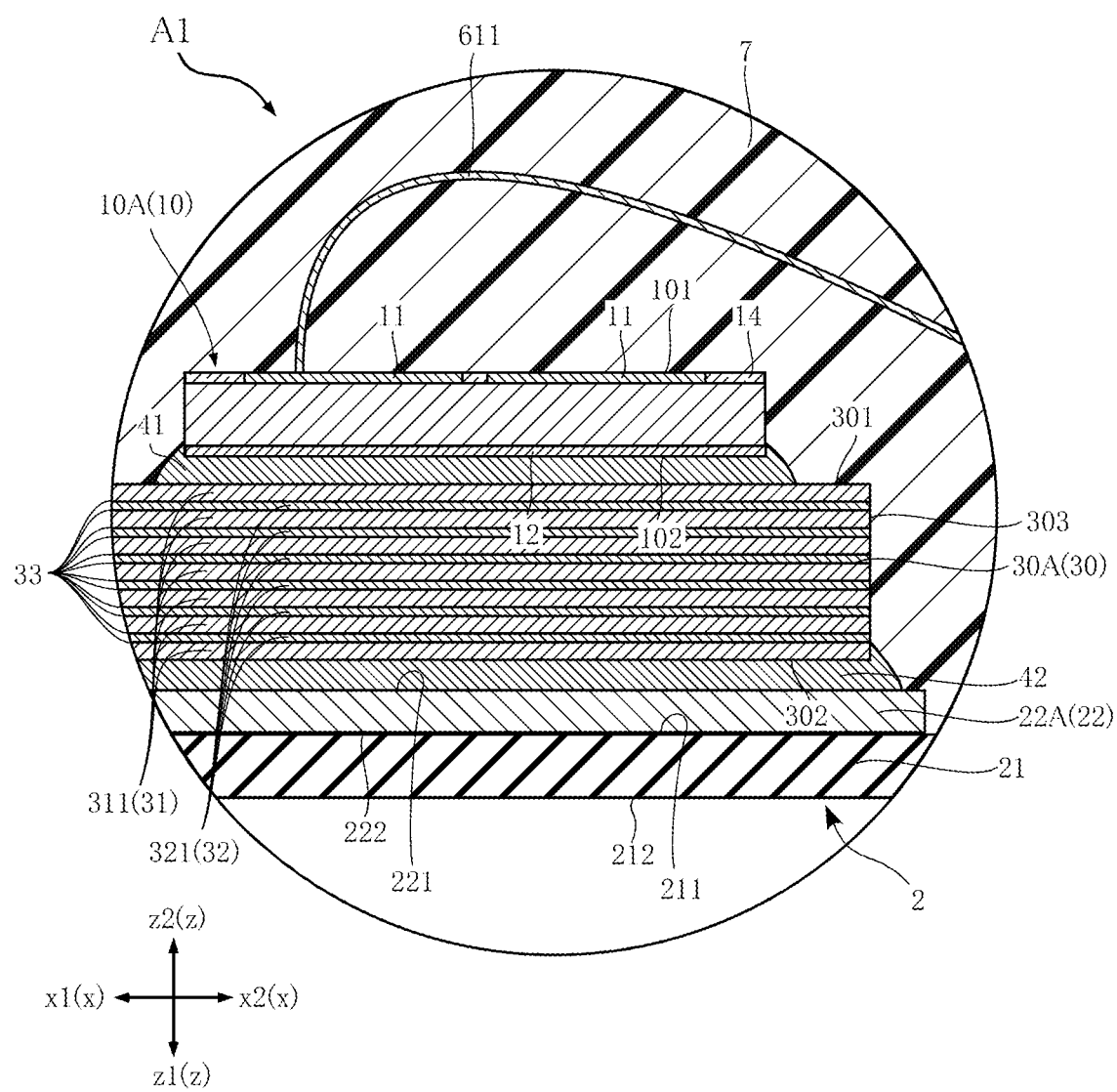
FIG. 13 is a sectional view taken along line XIII-XIII in FIG. 12.
Figure 14:
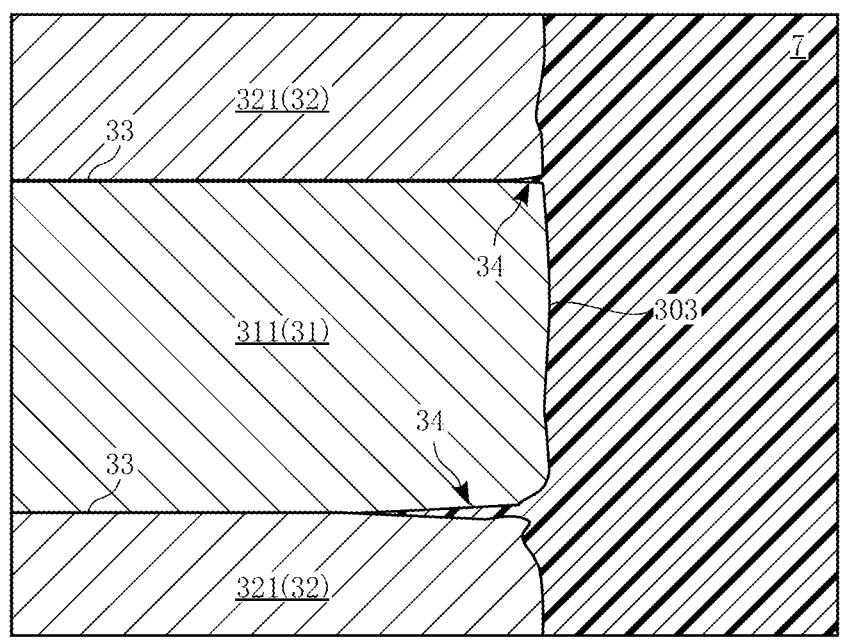
FIG. 14 is a schematic sectional view of a metal part according to the first embodiment.
Figure 14:
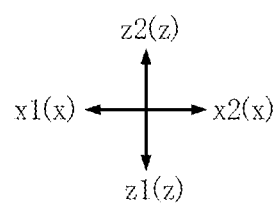

FIG. 1 is a perspective view showing the semiconductor device A1. FIG. 2 is a plan view showing the semiconductor device A1. FIG. 3 is a view corresponding to the plan view of FIG. 2, with the sealing member 7 indicated by imaginary lines (two-dot chain lines). FIG. 4 is a bottom view showing the semiconductor device A1. FIG. 5 is a side view (right-side view) showing the semiconductor device A1. FIG. 6 is a side view (left-side view) showing the semiconductor device A1. FIG. 7 is a front view showing the semiconductor device A1. FIG. 8 is a sectional view taken along line VIII-VIII in FIG. 3. FIG. 9 is a sectional view taken along line IX-IX in FIG. 3. FIG. 10 is a sectional view taken along line X-X in FIG. 3. FIG. 11 is a sectional view taken along line XI-XI in FIG. 3. FIG. 12 is an enlarged view of a portion of FIG. 3. FIG. 13 is a sectional view taken along line XIII-XIII in FIG. 12. FIG. 14 is a schematic sectional view of the metal part 30.

For the convenience of description, the three directions that are orthogonal to each other are defined as x direction, y direction and z direction, respectively. The z direction is the thickness direction of the semiconductor device A1. The x direction is the horizontal direction in plan view (see FIG. 2) of the semiconductor device A1. The y direction is the vertical direction in plan view (see FIG. 2) of the semiconductor device A1. Moreover, one sense of the x direction is referred to as "x1 direction", whereas the other sense of the x direction is referred to as "x2 direction". Similarly, one sense of the y direction is referred to as "y1 direction", whereas the other sense of the y direction is referred to as "y2 direction". Also, one sense of the z direction is referred to as "z1 direction", whereas the other sense of the z direction is referred to as "z2 direction". In the present disclosure, the z1 direction or sense may be referred to as "down", whereas the z2 direction or sense may be referred to as "up".

The semiconductor device A1 is a power converter (power module) used for a driving source of a motor, an inverter device for various electric appliances, and a DC/DC converter for various electric appliances, for example. The semiconductor device A1 may form a half-bridge type switching circuit.

Each of the semiconductor elements 10 may be a MOSFET, for example. Note however that each semiconductor element 10 is not limited to a MOSFET and may be a field effect transistor including a MISFET (Metal-Insulator-Semiconductor FET) or a switching element such as a bipolar transistor including IGBT. Alternatively, each semiconductor element 10 may be an IC chip such as LSI, a diode or a capacitor, rather than a switching element. Although the present embodiment shows the case where each semiconductor element 10 is an n-channel MOSFET, each semiconductor element 10 may be a p-channel MOSFET. Each semiconductor element 10 is made of a semiconductor material mainly composed of SiC (silicon carbide). The semiconductor material is not limited to SiC, but may be Si (silicon), GaAs (gallium arsenide), CaN (gallium nitride) or $Ga_2O_3$ (gallium oxide).

Each semiconductor element 10 is bonded to a respective one of the metal parts 30 by a first bonding layer 41. Each semiconductor element 10 is rectangular as viewed in the z direction (hereinafter also referred to as "as viewed in plan").

As shown in FIG. 13, each semiconductor element 10 has an obverse surface 101 and a reverse surface 102. The obverse surface 101 and the reverse surface 102 are spaced apart from each other in the z direction. The obverse surface 101 faces in the z2 direction, whereas the reverse surface 102 faces in the z1 direction. The reverse surface 102 is in contact with the first bonding layer 41 and faces the metal part 30.

As shown in FIGS. 12 and 13, each semiconductor element 10 has a first electrode 11, a second electrode 12, a third electrode 13 and an insulating film 14.

The first electrode 11 is disposed in proximity to the obverse surface 101 of each semiconductor element 10 in the z direction. The first electrode 11 is exposed on the obverse surface 101 of the semiconductor element 10. The first electrode 11 may be a source electrode through which source current flows. As shown in FIG. 12, the first electrode 11 may be divided into four portions.

The second electrode 12 is disposed in proximity to the reverse surface 102 of each semiconductor element 10 in the z direction. The second electrode 12 is exposed on the reverse surface 102 of the semiconductor element 10. The second electrode 12 may be a drain electrode through which drain current flows.

The third electrode 13 is disposed in proximity to the obverse surface 101 of each semiconductor element 10 in the z direction. The third electrode 13 is exposed on the obverse surface 101 of the semiconductor element 10. The third electrode 13 may be a gate electrode, through which a gate voltage (control voltage) for driving the semiconductor element 10 is applied. As viewed in plan, the third electrode 13 is smaller than each of the four portions of the first electrode 11.

The insulating film 14 is disposed in proximity to the obverse surface 101 of each semiconductor element 10 in the z direction. The insulating film 14 is exposed on the obverse surface 101 of the semiconductor element 10. The insulating film 14 surrounds the first electrode 11 and the third electrode 13, as viewed in plan. The insulating film 14 insulates the first electrode 11 and the third electrode 13 from each other. The insulating film 14 may be made up of a $SiO_2$ (silicon dioxide) layer, a $SiN_4$ (silicon nitride) layer and a poly benzoxazole layer that are deposited in the mentioned order, and the poly benzoxazole layer forms the outermost layer on the obverse surface 101 side of the semiconductor element 10. In the insulating film 14, the poly benzoxazole layer may be replaced with a polyimide layer.

The semiconductor elements 10 include a plurality of first elements 10A and a plurality of second elements 10B. As previously described, the semiconductor device A1 forms a half-bridge type switching circuit. The first elements 10A form an upper arm circuit in the switching circuit. The second elements 10B form a lower arm circuit in the switching circuit. As shown in FIG. 3, the semiconductor device A1 includes two (or a pair of) first elements 10A and two (or a pair of) second elements 10B. Note that the number of the semiconductor elements 10 is not limited to this and may vary in accordance with the function required for the semiconductor device A1.

The support member 2 supports the semiconductor elements 10 via the metal parts 30. The support member 2 includes an insulating substrate 21 and a plurality of wiring layers 22.

The wiring layers 22 are disposed on the insulating substrate 21. The insulating substrate 21 is electrically insulating. The insulating substrate 21 is made of, for example, a ceramic material having excellent thermal conductivity. Examples of such a ceramic material include AlN (aluminum nitride), SiN (silicon nitride) and $Al_2O_3$ (aluminum oxide). The insulating substrate 21 is in the form of a flat plate. As shown in FIG. 3, the insulating substrate 21 is rectangular as viewed in plan. The thickness (i.e., dimension in the z direction) of the insulating substrate 21 is not less than 0.2 mm and not more than 1.0 mm (e.g. 0.5 mm).

As shown in FIGS. 8-11, the insulating substrate 21 has an obverse surface 211 and a reverse surface 212. The obverse surface 211 and the reverse surface 212 are spaced apart from each other in the z direction. The obverse surface 211 faces in the z2 direction, whereas the reverse surface 212 faces in the z1 direction. The reverse surface 212 is exposed from the sealing member 7. The reverse surface 212 may be connected to a heat sink (not shown), for example. The configuration of the insulating substrate 21 is not limited to that of the illustrated example, and an insulating substrate may be provided individually for each of the wiring layers 22. The obverse surface 211 may correspond to the "second obverse surface" and the reverse surface 212 to the "second reverse surface" recited in the claims.

The wiring layers 22 are formed on the obverse surface 211 of the insulating substrate 21. The wiring layers 22 are spaced apart from each other. Each wiring layer 22 is made of a metal containing silver, for example. The material for each wiring layer 22 is not limited to a metal containing silver. For example, the material may be a metal containing copper. Such a metal layer containing copper may be plated with silver. Instead of such a silver-plating layer, a plurality of types of metal plating layers including an aluminum layer, a nickel layer and a silver layer may be deposited in the mentioned order. As viewed in plan, all of the wiring layers 22 are located inward of the peripheral edge of the insulating substrate 21. Each wiring layer 22 is rectangular as viewed in plan. Each wiring layer 22 is covered with the sealing member 7. The thickness (i.e., dimension in the z direction) of each wiring layer 22 is not less than 5 μm and not more than 80 μm.

As shown in FIG. 3, the wiring layers 22 include a pair of first wiring layers 22A, a pair of second wiring layers 22B and a third wiring layer 22C. The first wiring layers 22A, the second wiring layers 22B and the third wiring layer 22C are spaced apart from each other as viewed in plan.

The first wiring layers 22A are offset in the x1 direction on the insulating substrate 21. The first wiring layers 22A are spaced apart from each other in the y direction.

The second wiring layers 22B are offset in the x2 direction on the insulating substrate 21. The second wiring layers 22B are spaced apart from each other in the y direction. The second wiring layers 22B are located next to the first wiring layers 22A in the x direction.

The third wiring layer 22C is offset in the x1 direction on the insulating substrate 21. The third wiring layer 22C is located between the first wiring layers 22A.

Each of the wiring layers 22 (the first wiring layers 22A, the second wiring layers 22B and the wiring layer 22C) has an obverse surface 221 and a reverse surface 222. The obverse surface 221 and the reverse surface 222 are spaced apart from each other in the z direction. The obverse surface 221 faces in the z2 direction, whereas the reverse surface 222 faces in the z1 direction. With each wiring layer 22 bonded to the insulating substrate 21, the reverse surface 222 faces the obverse surface 211 of the insulating substrate 21. The obverse surface 221 may correspond to the "third obverse surface" and the reverse surface 222 to the "third reverse surface" recited in the claims.

Each of the metal parts 30 is disposed on a respective one of the wiring layers 22. Each metal part 30 is bonded to the wiring layer 22 (support member 2) with a second bonding layer 42. The semiconductor elements 10 are bonded to the metal parts 30 with the first bonding layers 41. The thickness (i.e., dimension in the z direction) of each metal part 30 is not less than 0.5 mm and not more than 5.0 mm (preferably, not less than 1.0 mm and not more than 3.0 mm).

As shown in FIG. 3, the metal parts 30 include a pair of first metal parts 30A, a pair of second metal parts 30B and a third metal part 30C. The first metal parts 30A, the second metal parts 30B and the third metal part 30C are spaced apart from each other as viewed in plan.

As shown in FIGS. 3 and 10, the first metal parts 30A are disposed on the first wiring layers 22A. On each of the first metal parts 30A, a respective one of the first elements 10A is bonded.

As shown in FIGS. 3, 8 and 9, the second metal parts 30B are disposed on the second wiring layers 22B. On each of the second metal parts 30B, a respective one of the second elements 10B is bonded.

As shown in FIGS. 3, 9 and 10, the third metal part 30C is disposed on the third wiring layer 22C. None of the semiconductor elements 10 is bonded to the third metal part 30C. Thus, the semiconductor device A1 may not include the third metal part 30C.

As shown in FIGS. 8-11 and 13, each of the metal parts 30 (the first metal parts 30A, the second metal parts 30B and the third metal part 30C) has an obverse surface 301, a reverse surface 302 and a plurality of side surfaces 303.

The obverse surface 301 and the reverse surface 302 are spaced apart from each other in the z direction. The obverse surface 301 faces in the z2 direction, whereas the reverse surface 302 faces in the z1 direction. With each semiconductor element 10 bonded to a respective metal part 30, the obverse surface 301 faces the reverse surface 102 of the semiconductor element 10. With each metal part 30 bonded to a respective wiring layer 22, the reverse surface 302 faces the obverse surface 221 of the wiring layer 22. The obverse surface 301 may correspond to the "first obverse surface" and the reverse surface 302 to the "first reverse surface" recited in the claims.

The side surfaces 303 are located between the obverse surface 301 and the reverse surface 302 in the z direction and connected to both of these surfaces. Each metal part 30 has a total of four side surfaces 303: a pair of side surfaces 303 that are spaced apart and face away from each other in the x direction and a pair of side surfaces 303 that are spaced apart and face away from each other in the y direction.

As shown in FIGS. 13 and 14, each of the metal parts 30 (the first metal parts 30A, the second metal parts 30B and the third metal part 30C) has a first metal body 31 and a second metal body 32. The first metal body 31 is made of a first metal material, and the second metal body 32 is made of a second metal material. The coefficient of thermal expansion of the second metal material is smaller than that of the first metal material. That is, the coefficient of linear thermal expansion of the second metal body 32 is smaller than that of the first metal body 31. The coefficient of linear thermal expansion of the second metal material is closer to that of the insulating substrate 21 (support member 2) than is the coefficient of linear thermal expansion of the first metal material. The first metal material may be a metal containing Cu (copper), whereas the second metal material may be a metal containing Mo (molybdenum), for example. The coefficient of linear thermal expansion of Cu is about 16 ppm/K, and the coefficient of linear thermal expansion of Mo is about 5.1 ppm/K. The second metal body 32 accounts for not less than 10% and not more than 40% (preferably 30%) of each metal part 30. The second metal material is not limited to a metal containing Mo and may be a metal containing W (tungsten), for example.

In each metal part 30, the first metal body 31 includes a plurality of first metal layers 311, and the second metal body 32 includes a plurality of second metal layers 321. In the example shown in FIG. 13, the first metal body 31 includes seven first metal layers 311, and the second metal body 32 includes six second metal layers 321. Each metal part 30 has a laminate structure in which the first metal layers 311 and the second metal layer 321 are alternately arranged in the z direction. As shown in FIG. 13, the first metal layers 311 in each metal part 30 include the outermost layer on the obverse surface 301 side and the outermost layer on the reverse surface 302 side. That is, the top layer and the bottom layer in the laminate structure of each metal part 30 are provided by the first metal layers 311. The thickness of each first metal layer 311 is larger than that of each second metal layer 321. For example, the thickness of each first metal layer 311 is not less than 0.1 mm and not more than 0.8 mm (preferably, not less than 0.2 mm and not more than 0.4 mm), and the thickness of each second metal layer 321 is not less than 0.1 mm and not more than 0.5 mm (preferably, 0.1 mm). The numbers of the first metal layers 311 and the second metal layers 321 are not particularly limited. However, in order for the outermost layers on both the obverse surface 301 side and the reverse surface 302 side to be provided by the first metal layers 311, the number of the first metal layers 311 needs to be larger than that of the second metal layers 321.

As shown in FIGS. 13 and 14, each metal part 30 has a plurality of interfaces 33. Each interface 33 is the interface between one of the first metal layers 311 and one of the second metal layers 321 that adjoin each other. Each metal part 30 has a crack 34 that extends from one of the side surfaces 303 into the metal part, as viewed in plan. The crack 34 extends not less than 10 μm and not more than 100 μm (preferably, not less than 20 μm and not more than 40 μm) from the side surface 303. The crack 34 is formed due to partial detachment at the interface 33. Thus, the interface 33 formed by a first metal layer 311 and a second metal layer 321 includes portions where these metal layers are in contact with each other and portions where these metal layers are not in contact with each other. The crack 34 need not be formed at all of the interfaces 33, and it is only required that the crack 34 is formed at one or more interfaces 33. Also, the crack 34 need not extend from all of the side surfaces 303, and it is only required that the crack 34 extends from one or more of the side surfaces 303. As shown in FIG. 14, the crack 34 is filled with the sealing member 7. Note that each metal part 30 may not be formed with a crack 34.

As previously described, each metal part 30 includes first metal layers 311 made of a first metal material (e.g. Cu) and second metal layers 321 made of a second metal material (e.g. Mo). The coefficient of linear thermal expansion of the second metal material is smaller than that of the first metal material. Thus, the coefficient of linear thermal expansion of each metal part 30 is smaller than in the case where the metal part is made of the first metal material alone. In the semiconductor device A1, the coefficient of linear thermal expansion of each metal part 30 as a whole is not less than 3 ppm/K and not more than 14 ppm/K (preferably, not less than 7 ppm/K and not more than 11 ppm/K).

The first bonding layers 41 are interposed between the semiconductor elements 10 and the metal parts 30 to bond these to each other. The first bonding layers 41 may be solder, for example. The solder may contain lead or may be lead-free. The first bonding layers 41 are not limited to solder and may be other conductive bonding materials such as sintered metal. The first bonding layers 41 may correspond to the "conductive bonding material" recited in the claims.

The second bonding layers 42 are interposed between the metal parts 30 and the wiring layers 22 to bond these to each other. The second bonding layers 42 may be solder, for example. The solder may contain lead or may be lead-free. The second bonding layers 41 are not limited to solder and may be other conductive bonding materials such as sintered metal or insulating bonding materials (adhesive). The second bonding layer 42 may correspond to the "bonding layer" recited in the claims.

The input terminals 51, the output terminals 52, the control terminals 53 and the detection terminals 54 are made of copper or copper alloy. The input terminals 51, the output terminals 52, the control terminals 53 and the detection terminals 54 are obtained from a same lead frame.

As shown in FIGS. 1-4, the input terminals 51 are offset in the x1 direction in the semiconductor device A1. The input terminals 51 are spaced apart from each other in the y direction. The input terminals 51 are connected to an external DC power supply. A DC voltage is applied across the input terminals 51. Each of the input terminals 51 is partially covered with the sealing member 7 and hence supported by the sealing member 7.

The input terminals 51 include a first input terminal 51A and a second input terminal 51B. The first input terminal 51A is a positive electrode (P terminal), whereas the second input terminal 51B is a negative electrode (N terminal). Each of the first input terminal 51A and the second input terminal 51B (the paired input terminals 51) includes a pad portion 511 and a terminal portion 512.

The pad portions 511 are located on the outer side of the peripheral edge of the support member 2 as viewed in plan and spaced apart from the support member 2 in the z direction. The pad portions 511 are covered with the sealing member 7. The surfaces of the pad portions 511 may be plated with silver, for example.

The terminal portions 512 are connected to the pad portions 511 and exposed from the sealing member 7. The terminal portions 512 are used in mounting the semiconductor device A1 to a circuit board. Each terminal portion 512 is L-shaped as viewed in the y direction. The surfaces of the terminal portions 512 may be plated with nickel, for example.

Each terminal portion 512 has a base part 513 and a standing part 514. The base parts 513 are connected to the pad portions 511 and extend out from the sealing member 7 (side surface 731 described later) in the x direction. Each standing part 514 extends in the z2 direction from the end of the base part 513 in the x direction.

As shown in FIGS. 1-4, the output terminals 52 are offset in the x2 direction in the semiconductor device A1. As shown in FIGS. 1-4, the output terminals 52 are spaced apart from each other in the y direction. Alternating current power (AC voltage) converted by the semiconductor elements 10 is output from the output terminals 32. Each of the output terminals 52 is partially covered with the sealing member 7 and hence supported by the sealing member 7. Each of the output terminals 52 includes a pad portion 521 and a terminal portion 522.

The pad portions 521 are located on the outer side of the peripheral edge of the support member 2 as viewed in plan and spaced apart from the support member 2 in the z direction. The pad portions 521 are covered with the sealing member 7. The surfaces of the pad portions 521 may be plated with silver, for example.

The terminal portions 522 are connected to the pad portions 521 and exposed from the sealing member 7. The terminal portions 522 are used in mounting the semiconductor device A1 to a circuit board. Each terminal portion 522 is L-shaped as viewed in the y direction. The shape of the terminal portions 522 are generally the same as that of the terminal portion 512 of each input terminal 51. The surfaces of the terminal portions 522 may be plated with nickel, for example.

Each terminal portion 522 has a base part 523 and a standing part 524. The base parts 523 are connected to the pad portions 521 and extend out from the sealing member 7 (side surface 732 described later) in the x direction. Each standing part 524 extends in the z2 direction from the end of the base part 523 in the x direction.

As shown in FIGS. 1-4, the control terminals 53 are on each side of the semiconductor device A1 in the x direction. The control terminals 53 on the x1 side are located between the input terminals 51 in the y direction. The control terminals 53 on the x2 side are located between the output terminals 52 in the y direction. The number of the control terminals 53 corresponds to the number of the semiconductor elements 10. Thus, the semiconductor device A1 has four control terminals 53. A control voltage (gate voltage) for driving a corresponding semiconductor element 10 is applied to each of the control terminals 53. Each control terminal 53 is partially covered with the sealing member 7 and hence supported by the sealing member 7. Each control terminal 53 includes a pad portion 531 and a terminal portion 532.

The pad portions 531 are located on the outer side of the peripheral edge of the support member 2 as viewed in plan and spaced apart from the support member 2 in the z direction. The pad portions 531 are covered with the sealing member 7. The surfaces of the pad portions 531 may be plated with silver, for example.

The terminal portions 532 are connected to the pad portions 531 and exposed from the sealing member 7. The terminal portions 532 are used in mounting the semiconductor device A1 to a circuit board. Each terminal portion 532 is L-shaped as viewed in the y direction. The surfaces of the terminal portions 532 may be plated with nickel, for example.

Each terminal portion 532 has a base part 533 and a standing part 534. The base parts 533 are connected to the pad portions 531 and extend out from the sealing member 7 (side surface 731 or 732 described later) in the x direction. The dimension of each base part 533 in the x direction is smaller than the dimension of the base part 513 of each input terminal 51 and the dimension of the base part 523 of each output terminal 52 in the x direction. Each standing part 534 extends in the z2 direction from the end of the base part 533 in the x direction.

As shown in FIGS. 1-4, the detection terminals 54 are on each side of the semiconductor device A1 in the x direction. The detection terminals 54 on the x1 side are located between the input terminals 51 in the y direction. The detection terminals 54 on the x2 side are located between the output terminals 52 in the y direction. The number of the detection terminals 54 corresponds to the number of the semiconductor elements 10. Thus, the semiconductor device A1 has four detection terminals 54. A voltage corresponding to the current (source current) flowing through the first electrode 11 of each semiconductor element 10 is applied to a corresponding detection terminal 54. Each of the detection terminals 54 includes a pad portion 541 and a terminal portion 542.

The pad portions 541 are located on the outer side of the peripheral edge of the support member 2 as viewed in plan and spaced apart from the support member 2 in the z direction. The pad portions 541 are covered with the sealing member 7. The surfaces of the pad portions 541 may be plated with silver, for example.

The terminal portions 542 are connected to the pad portions 541 and exposed from the sealing member 7. The terminal portions 542 are used in mounting the semiconductor device A1 to a circuit board. Each terminal portion 542 is L-shaped as viewed in the y direction. The surfaces of the terminal portions 542 may be plated with nickel, for example.

Each terminal portion 542 has a base part 543 and a standing part 544. The base parts 543 are connected to the pad portions 541 and extend out from the sealing member 7 (side surface 731 or 732 described later) in the x direction. The dimension of each base part 543 in the x direction is generally the same as the dimension of the base part 533 of each control terminal 53 in the x direction and smaller than the dimension of the base part 513 of each input terminal 51 and the dimension of the base part 523 of each output terminal 52 in the x direction. Each standing part 544 extends in the z2 direction from the end of the base part 543 in the x direction.

Each of the connecting members 6 electrically connects two mutually spaced members to each other. As shown in FIG. 3, the connecting members 6 include a plurality of first wires 611, a plurality of second wires 612, plurality of third wires 613, a plurality of fourth wires 614, a first conduction member 621, a second conduction member 622, a third conduction member 623 and fourth conduction members 624.

The first wires 611 are bonded to the first electrodes 11 of the first elements 10A and the obverse surfaces 301 of the second metal parts 30B. Thus, each of the second metal parts 30B (each second wiring layer 22B) is electrically connected to the first electrode 11 of a respective first element 10A by the first wires 611. The first wires 611 may be made of a metal containing aluminum, a metal containing copper, or a metal containing gold, for example.

The second wires 612 are bonded to the first electrodes 11 of the second elements 10B and the obverse surface 301 of the third metal part 30C. Thus, the third metal part 30C (third wiring layer 22C) is electrically connected to the first electrodes 11 of the second elements 10B by the second wires 612. The second wires 612 may be made of a metal containing aluminum, a metal containing copper, or a metal containing gold, for example.

Each of the third wires 613 is bonded to the third electrode 13 of a respective one of the semiconductor elements 10 and the pad portion 531 of a respective one of the control terminals 53. Thus, each control terminal 53 is electrically connected to the third electrode 13 of the corresponding semiconductor element 10 by one of the third wires 613. The third wires 613 may be made of a metal containing aluminum, a metal containing copper, or a metal containing gold, for example.

Each of the fourth wires 614 is bonded to the first electrode 11 of a respective one of the semiconductor elements 10 and the pad portion 541 of a respective one of the detection terminals 54. Thus, each detection terminal 54 is electrically connected to the first electrode 11 of the corresponding semiconductor element 10 by one of the fourth wires 614. The fourth wires 614 may be made of a metal containing aluminum, a metal containing copper, or a metal containing gold, for example.

As shown in FIGS. 3 and 10, the first conduction member 621 is bonded to the obverse surface 301 of one of the first metal parts 30A and the obverse surface 301 of the other one of the first metal parts 30A. Thus, the first metal parts 30A (the pair of first wiring layers 22A) are electrically connected to each other. As viewed in plan, the first conduction member 621 extends in the y direction across the third wiring layer 22C. As shown in FIG. 3, the first conduction member 621 may be constituted of a plurality of bonding wires. These bonding wires may be made of a metal containing aluminum, a metal containing copper, or a metal containing gold, for example.

As shown in FIGS. 3 and 8, the second conduction member 622 is bonded to the pad portion 511 of the first input terminal 51A and the obverse surface 301 of one of the first metal parts 30A. Thus, the first input terminal 51A is electrically connected to the one of the first metal parts 30A (one of the first wiring layers 22A) by the second conduction member 622. In this manner, the first input terminal 51A is electrically connected to the second electrode 12 of one of the first elements 10A via the second conduction member 622 and one of the first metal parts 30A (one of the first wiring layers 22A). As shown in FIG. 3, the second conduction member 622 may be constituted of a plurality of bonding wires. These bonding wires may be made of a metal containing aluminum, a metal containing copper, or a metal containing gold, for example.

As shown in FIG. 3, the third conduction member 623 is bonded to the pad portion 511 of the second input terminal 51B and the obverse surface 221 of the third wiring layer 22C. Thus, the second input terminal 51B is electrically connected to the first electrode 11 of each second element 10B via the third conduction member 623, the third metal part 30C (the third wiring layer 22C) and the second wires 612. As shown in FIG. 3, the third conduction member 623 may be constituted of a plurality of bonding wires. These bonding wires may be made of a metal containing aluminum, a metal containing copper, or a metal containing gold, for example.

As shown in FIGS. 3 and 8, the paired fourth conduction members 624 are bonded to the pad portions 521 of the output terminals 52 and the obverse surfaces 301 of the second metal parts 30B. Thus, the output terminals 52 are electrically connected to the second electrodes 12 of the respective second elements 10B via the fourth conduction members 624 and the second metal parts 30B (the second wiring layers 22B). The output terminals 52 are also electrically connected to the first electrodes 11 of the respective first elements 10A via the fourth conduction members 624, the second metal parts 30B (second wiring layers 22B) and the first wires 611. As shown in FIG. 3, each of the fourth conduction member 624 may be constituted of a plurality of bonding wires. These bonding wires may be made of a metal containing aluminum, a metal containing copper, or a metal containing gold, for example.

Note that each of the first conduction member 621, the second conduction member 622, the third conduction member 623 and the fourth conduction members 624 may not be constituted of a plurality of bonding wires and may be metal leads or bonding ribbons. Such metal leads or bonding ribbons may be made of a metal containing aluminum, a metal containing copper, or a metal containing gold, for example.

The sealing member 7 is a package of the semiconductor device A1. As shown in FIGS. 1-11, the sealing member 7 covers the constituent members of the semiconductor device A1. Note however that the support member 2, the input terminals 51, the output terminal 52, the control terminals 53 and the detection terminal 54 are covered with the sealing member only partially, rather than entirely. The sealing member 7 may be made of epoxy resin, for example. The sealing member 7 may be not less than 20 mm and not more than 120 mm (preferably, not less than 25 mm and not more than 60 mm) in the dimension in the x direction, not less than 20 mm and not more than 120 mm (preferably, not less than 40 mm and not more than 70 mm) in the dimension in the y direction, and not less than 5 mm and not more than 10 mm (preferably 7 mm) in the dimension in the z direction. The sealing member 7 has an obverse surface 71, a reverse surface 72, a plurality of side surfaces 731-734, and a pair of mounting holes 74.

As shown in FIGS. 5-7, the obverse surface 71 and the reverse surface 72 are spaced apart from each other in the z direction. The obverse surface 71 faces in the z2 direction, whereas the reverse surface 72 faces in the z1 direction. As shown in FIG. 4, the reverse surface 72 is in the form of a frame surrounding the reverse surface 212 of the insulating substrate 21, as viewed in plan. The reverse surface 212 of the insulating substrate 21 is exposed from the reverse surface 72. The side surfaces 731-734 are located between the obverse surface 71 and the reverse surface 72 in the z direction and connected to both of these surfaces. As shown in FIG. 3, the side surfaces 731 and 732 are spaced apart from each other in the x direction. The side surface 731 faces in the x1 direction, whereas the side surface 732 faces in the x2 direction. As shown in FIG. 3, the side surfaces 733 and 734 are spaced apart from each other in the y direction. The side surface 733 faces in the y1 direction, whereas the side surface 734 faces in the y2 direction.

As shown in FIG. 3, the terminal portions 512 of the input terminals 51, and the terminal portions 532 and 542 of the control terminals 53 and detection terminals 54 arranged correspondingly to the second elements 10B are exposed from the side surface 731. Also, as shown in FIG. 3, the terminal portions 522 of the output terminals 52, and the terminal portions 532 and 542 of the control terminals 53 and detection terminals 54 that are arranged correspondingly to the first elements 10A are exposed from the side surface 732.

As shown in FIGS. 5-7 and 10, the mounting holes 74 extend from the obverse surface 71 to the reverse surface 72 in the z direction, penetrating the sealing member 7. As shown in FIGS. 2-4, each of the mounting holes 74 is circular as viewed in plan, for example. The mounting holes 64 are located on each side of the insulating substrate 21 in the y direction. The mounting holes 74 are spaced apart from each other in the y direction by not less than 15 mm and not more than 100 mm (preferably, not less than 30 mm and not more than 70 mm). The mounting holes 74 may be used in mounting the semiconductor device A1 to a heat sink.

The advantages of the semiconductor device A1 having the above-described configuration are described below.

The semiconductor device A1 is provided with the semiconductor elements 10, the support member 2 and the metal parts 30. The semiconductor elements 10 are bonded to the metal parts 30 with the first bonding layers 41, and the metal parts 30 are bonded to the support member 2 with the second bonding layers 42. Each of the metal parts 30 includes a first metal body 31 made of a first metal material and a second metal body 32 made of a second metal material, and there exists a boundary (corresponding to the interface 33) between the first metal body 31 and the second metal body 32. The coefficient of linear thermal expansion of the second metal material is smaller than that of the first metal material. With such a configuration, when a metal part 30 thermally expands due to the heat from the semiconductor element 10, thermal strain occurs near the boundary between the first metal body 31 and the second metal body 32, which reduces the thermal stress near the boundary. Thus, the thermal stress due to the thermal expansion of the metal part 30 can be reduced as compared with case where the metal part 30 is made of the first metal material alone. As a result, less thermal stress is exerted to the second bonding layer 42 adjoining the metal part 30, which prevents cohesive failure of the second bonding layer 42. This leads to reduction of product failures such as poor joining or poor electrical conduction, so that the semiconductor device A1 has an improved reliability. The semiconductor device A1 can also reduce the thermal stress exerted to the first bonding layer 41 adjoining the metal part 30, which prevents cohesive failure of the first bonding layer 41 as well.

In the semiconductor device A1, the thickness of each metal part 30 is larger than that of the support member 2 and not less than 0.5 mm and not more than 5 mm (preferably, not less than 1.0 mm and not more than 3 mm). In a semiconductor device different from the semiconductor device A1 of the present disclosure, it is possible to reduce the thermal stress by making the thickness of each metal part smaller than that of the metal parts 30 and thereby reducing the rigidity of each metal part. However, such an approach (i.e., making the metal parts thinner) may cause deflection of the metal parts, resulting in the sealing member 7 entering between the metal parts and the support member 2, which may lead to a breakage (crack) of the support member 2. Moreover, making the metal parts thinner may reduce the efficiency of thermal diffusion through the metal parts. In contrast, the semiconductor device A1 employs metal parts 30 each including a first metal body 31 and a second metal body 32 so that the thermal stress by the metal parts 30 is reduced, as described before. Thus, the semiconductor device A1 reduces the thermal stress exerted to the second bonding layer 42 while also preventing breakage of the support member 2 and reduction of the efficiency of thermal diffusion.

In each of the metal parts 30 of the semiconductor device A1, the first metal body 31 includes a plurality of first metal layers 311, and the second metal body 32 includes a plurality of second metal layers 321. The first metal layers 311 and the second metal layers 321 are alternately arranged in the z direction. Thus, each metal part 30 has a laminate structure made up of the first metal layers 311 and the second metal layer 321. Such a configuration improves the thermal conductivity in the thickness direction z as compared with a configuration where each metal part 30 is made of an alloy (solid solution) of the first metal material and the second metal material.

In the semiconductor device A1, the thickness (i.e., dimension in the z direction) of each second metal layer 321 is smaller than the thickness (i.e., dimension in the z direction) of each first metal layer 311. The thermal conductivity of the second metal material is lower than that of the first metal material, so that the efficiency of thermal diffusion may be reduced as compared with the case where each metal part 30 is made of the first metal material alone. In the semiconductor device A1, the second metal layers 321 with a lower thermal conductivity are made thinner so that reduction of thermal diffusion efficiency is suppressed as compared with the case where the first metal layers 311 and the second metal layers 321 have the same thickness.

In the semiconductor device A1, each metal part 30 is formed with a crack 34 at the interface 33 between the first metal layer 311 and the second metal layer 321. The crack 34 is a partial detachment at the interface 33. With such a configuration, thermal stress by the metal part 30 is reduced at the portion where such a crack 34 exists between the first metal layer 311 and the second metal layer 321. Thus, the semiconductor device A1 has an improved reliability against thermal stress. Moreover, since such a crack 34 is filled with the sealing member 7, the adhesion strength between the metal part 30 and the sealing member 7 is enhanced by anchoring effect. Thus, the semiconductor device A1 enhances the adhesion strength of the sealing member 7 while reducing the thermal stress.

In the semiconductor device A1, the first metal layers 311 in each metal part 30 include the outermost layer on the obverse surface 301 side and the outermost layer on the reverse surface 302 side. In other words, the opposite surfaces of each metal part 30 in the z direction are both provided by the first metal layers 311. Such a configuration enhances heat dissipation from the semiconductor element 10 at an initial stage. Moreover, the first bonding layer 41 and the second bonding layer 42 have lower adhesion force to the second metal layers 321 than to the first metal layers 311. Since both of the opposite surfaces of each metal part 30 in the z direction are provided by the first metal layers 311, the first bonding layers 41 and the second bonding layers 42 reliably adhere to the metal part 30.

In the semiconductor device A1, each metal part 30 includes the first metal body 31 made of the first metal material and the second metal body 32 made of the second metal material. Moreover, in each metal part 30, the coefficient of linear thermal expansion of the second metal material is closer to the coefficient of linear thermal expansion of the insulating substrate 21 than is the coefficient of linear thermal expansion of the first metal material. Such a configuration makes the coefficient of linear thermal expansion of each metal part 30 closer to that of the insulating substrate 21 as compared with the case where each metal part 30 is made of the first metal material alone. Since the difference between the coefficient of linear thermal expansion of each metal part 30 and that of the insulating substrate 21 is small, thermal stress exerted to the second bonding layer 42 is reduced.

In the semiconductor device A1, the support member 2 includes the insulating substrate 21. The insulating substrate 21 is made of a ceramic material having excellent thermal conductivity. With such a configuration, the heat generated from the semiconductor element 10 is diffused through the metal parts 30 and conducted to the insulating substrate 21. Since the semiconductor device A1 diffuses the heat from the semiconductor element 10 to the metal parts 30 and the insulating substrate 21, the semiconductor element 10 has an improved heat diffusion efficiency. Moreover, the reverse surface 212 of the insulating substrate 21 is exposed from the sealing member 7. Such a configuration allows the heat conducted to the insulating substrate 21 to be dissipated to the outside through the reverse surface 212. If the semiconductor device A1 is provided with a heat sink, the heat is conducted from the reverse surface 212 to the heat sink.

Thus, the semiconductor device A1 efficiently dissipates the heat from the semiconductor elements 10.

Figure 15:
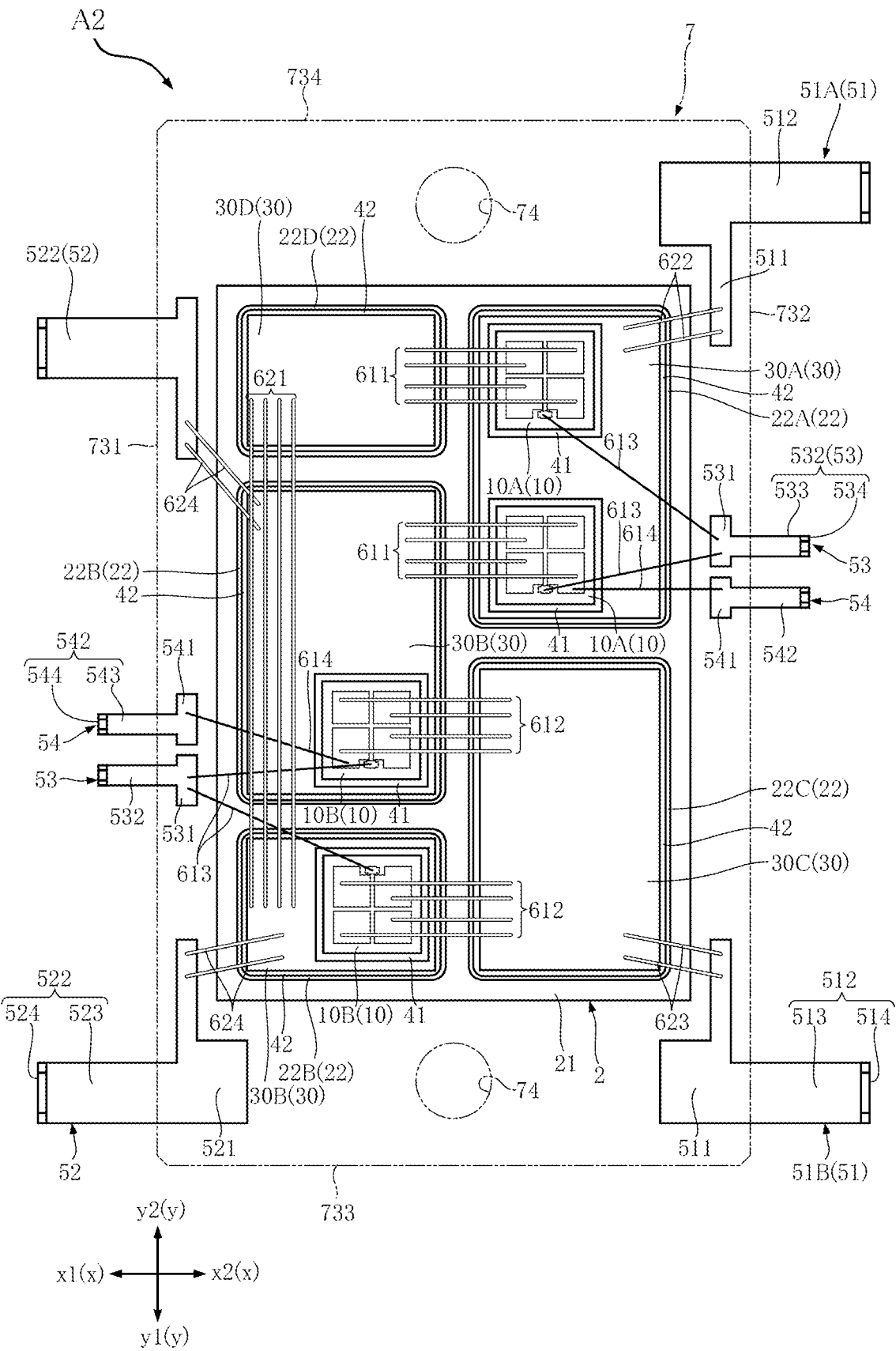
FIG. 15 is a plan view showing a semiconductor device according to a second embodiment.

FIG. 15 shows a semiconductor device A2 according to a second embodiment. FIG. 15 is a plan view of the semiconductor device A2, with the sealing member 7 indicated by imaginary lines (two-dot chain lines). The semiconductor device A2 differs from the semiconductor device A1 mainly in configuration of the wiring layers 22 of the support member 2, and accordingly differs also in arrangement of the semiconductor elements 10, the metal parts 30, the input terminals 51, the output terminals 52, the control terminals 53, the detection terminals 54 and the connecting members 6.

As shown in FIG. 15, the wiring layers 22 of the support member 2 include a first wiring layer 22A, a pair of second wiring layers 22B, a third wiring layer 22C and a fourth wiring layer 22D. In this way, unlike the semiconductor device A1, the semiconductor device A2 has a single first wiring layer 22A and additionally includes a fourth wiring layer 22D.

The first wiring layer 22A is offset in the x2 direction and in the y2 direction on the insulating substrate 21. The second wiring layers 22B are offset in the x1 direction and in the y1 direction on the insulating substrate 21. The second wiring layers 22B are located next to each other in the y direction. The third wiring layer 22C is offset in the x2 direction and in the y1 direction. The third wiring layer 22C is located next to the first wiring layer 22A in the y direction. The third wiring layer 22C and the first wiring layer 22A have the generally same shape. The fourth wiring layer 22D is offset in the x1 direction and in the y2 direction. The fourth wiring layer 22D is located next to the first wiring layer 22A in the x direction. The fourth wiring layer 22D has the generally same shape as one of the second wiring layers 22B.

As shown in FIG. 15, the metal parts 30 include a first metal part 30A, a pair of second metal parts 30B, a third metal part 30C and a fourth metal part 30D. In this way, unlike the semiconductor device A1, the semiconductor device A2 has a single first metal part 30A and additionally includes a fourth metal part 30D.

The first metal part 30A is bonded to the first wiring layer 22A with a second bonding layer 42. To the first metal part 30A, two first elements 10A are bonded with first bonding layers 41. That is, in this embodiment, two semiconductor elements 10 (first elements 10A) are bonded to a single metal part 30 (first metal part 30A).

As with the first embodiment, the second elements 10B are bonded to the second metal parts 30B with the first bonding layers 41. None of the semiconductor elements 10 are bonded to the fourth metal part 30D. To the fourth metal part 30D, a plurality of first wires 611 and a first conduction member 621 are bonded.

In the semiconductor device A2, the first conduction member 621 is bonded to the fourth metal part 30D and one of the second metal parts 30B to electrically connect these members to each other.

In the semiconductor device A2, the input terminals 51 are offset in the x2 direction, as shown in FIG. 15. The input terminals 51 are spaced apart from each other in the y direction, with the first input terminal 51A offset in the y2 direction and the second input terminal 51B offset in the y1 direction.

In the semiconductor device A2, the first input terminal 51A is electrically connected to the second electrode 12 of each first element 10A via the second conduction member 622 and the first metal part 30A. The second input terminal 51B is electrically connected to the first electrode 11 of each second element 10B via the third conduction member 623, the third metal part 30C and the second wires 612.

In the semiconductor device A2, the output terminals 52 are offset in the x1 direction, as shown in FIG. 15. In the semiconductor device A2, the output terminal 52 offset in the y1 direction is electrically connected to the second electrode 12 of one of the second elements 10B via the fourth conduction member 624 and one of the second metal parts 30B and is also electrically connected to the first electrode 11 of one of the first elements 10A via the fourth conduction member 624, that second metal part 30B, the first conduction member 621, the fourth metal part 30D and the first wires 611. The output terminal 52 offset in the y2 direction is electrically connected to the second electrode 12 of the other one of the second elements 10B via the fourth conduction member 624 and the other one of the second metal parts 30B and is also electrically connected to the first electrode 11 of the other one of the first elements 10A via the fourth conduction member 624, that second metal part 30B and the first wires 611.

The semiconductor device A2 includes a control terminal 53 partially projecting from the side surface 731 and a control terminal 53 partially projecting from the side surface 732. The control terminal 53 partially projecting from the side surface 731 is electrically connected to the third electrode 13 of each second element 10B by third wires 613. The control terminal 53 partially projecting from the side surface 732 is electrically connected to the third electrode 13 of each first element 10A by third wires 613. In this way, in the present embodiment, two control terminals 53 are provided, and one of the control terminals 53 is common for the first elements 10A and the other control terminal 53 is common for the second elements 10B. However, the present disclosure is not limited to such a configuration. For example, as with the semiconductor device A1, four control terminals 53 may be provided to correspond to the semiconductor elements 10 (a pair of first elements 10A and a pair of second elements 10B).

The semiconductor device A2 includes a detection terminal 54 partially projecting from the side surface 731 and a detection terminal 54 partially projecting from the side surface 732. The detection terminal 54 partially projecting from the side surface 732 is electrically connected to the first electrode 11 of one of the first elements 10A by a fourth wire 614. The detection terminal 54 partially projecting from the side surface 731 is electrically connected to the first electrode 11 of one of the second elements 10B by a fourth wire 614. In this way, in the present embodiment, two detection terminal terminals 54 are provided, and one of the detection terminals 54 is electrically connected to one of the first elements 10A and the other detection terminal 54 is electrically connected to one of the second elements 10B. However, the present disclosure is not limited to such a configuration. For example, similarly to the semiconductor device A1, four detection terminals 54 may be provided to correspond to the semiconductor elements 10 (a pair of first elements 10A and a pair of second elements 10B).

The advantages of the semiconductor device A2 having the above-described configuration are described below.

The semiconductor device A2 is provided with the semiconductor elements 10, the support member 2 and the metal parts 30. The semiconductor elements 10 are bonded to the metal parts 30 with the first bonding layers 41, and the metal parts 30 are bonded to the support member 2 with the second bonding layers 42. Each of the metal parts 30 includes a first metal body 31 and a second metal body 32, and there exists a boundary (corresponding to the interface 33) between the first metal body 31 and the second metal body 32. The first metal body 31 is made of a first metal material while the second metal body 32 is made of a second metal material, and the coefficient of linear thermal expansion of the second metal material is smaller than that of the first metal material. Thus, as with the semiconductor device A1, the semiconductor device A2 reduces the thermal stress exerted to the second bonding layer 42 adjoining the metal part 30, so that cohesive failure of the second bonding layers 42 is prevented. This leads to reduction of product failures such as poor joining or poor electrical conduction, so that the semiconductor device A2 has an improved reliability.

The semiconductor device A2 provides the same advantages as those of the semiconductor device A1 because of the configuration that is the same or similar to the semiconductor device A1.

In the first and the second embodiments, the metal parts 30 are bonded to the wiring layers 22 with the second bonding layers 42. However, the present disclosure is not limited to this configuration. For example, the metal part 30 may be bonded to the insulating substrate 21 with the second bonding layers 42. That is, the support member 2 may not include the wiring layers 22. Such a configuration also allows for reduction of thermal stress to the second bonding layers 42 adjoining the metal parts 30.

The first and the second embodiments show the case where the first input terminal 51A is electrically connected to the first metal part 30A via the second conduction member 622. However, the first input terminal 51A may be electrically connected to the first metal part 30A by direct bonding to the first metal part. Similarly, although the case where the second input terminal 51B is electrically connected to the third metal part 30C via the third conduction member 623 is shown, the second input terminal 51B may be electrically connected to the third metal part 30C by direct bonding to the third metal part. Further, although the case where the output terminals 52 are electrically connected to the respective second metal parts 30B via the fourth conduction members 624 is shown, the output terminals 52 may be electrically connected to the second metal parts 30B by direct bonding to the second metal parts.

Figure 16:
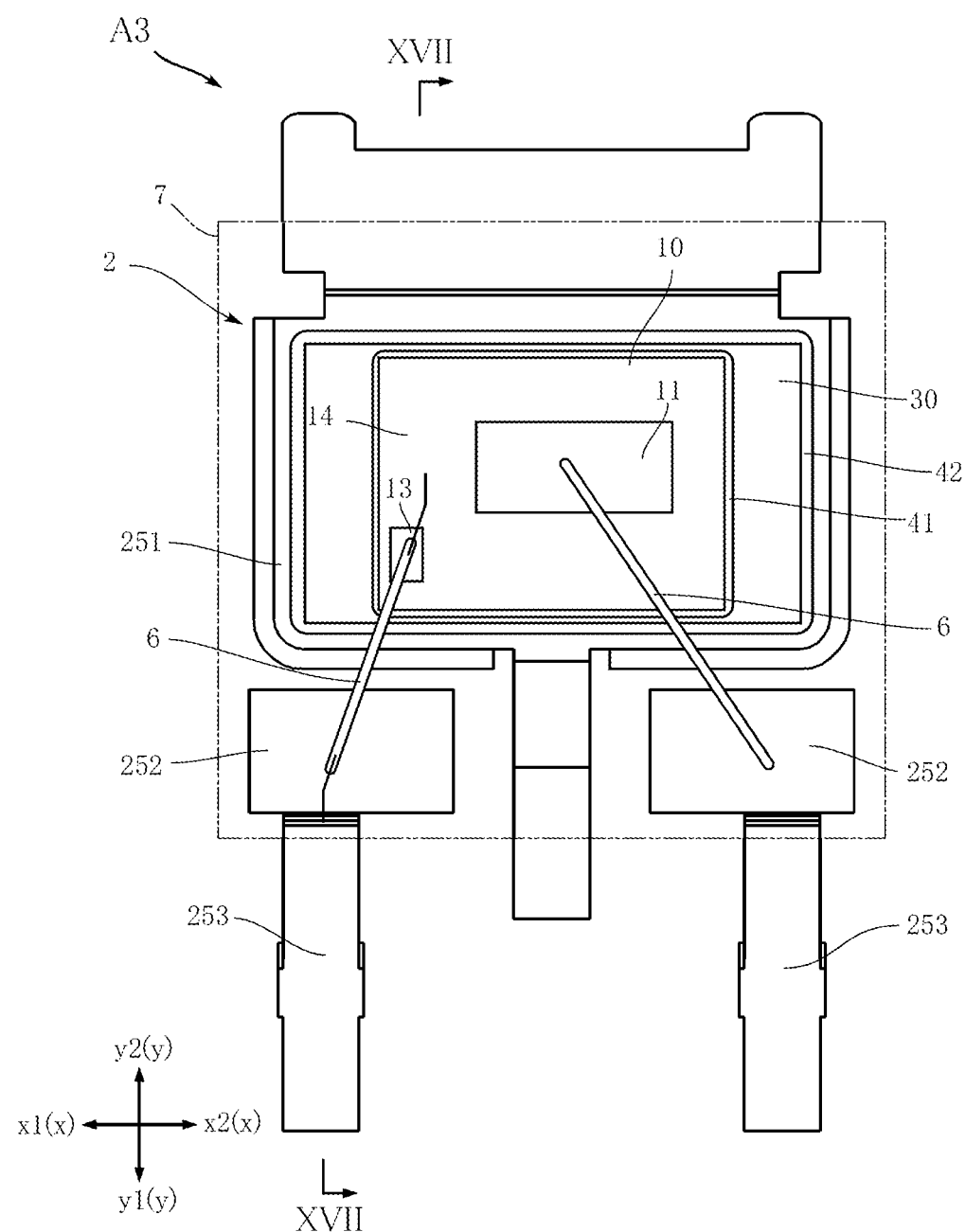
FIG. 16 is a plan view showing a semiconductor device according to a third embodiment.
Figure 17:
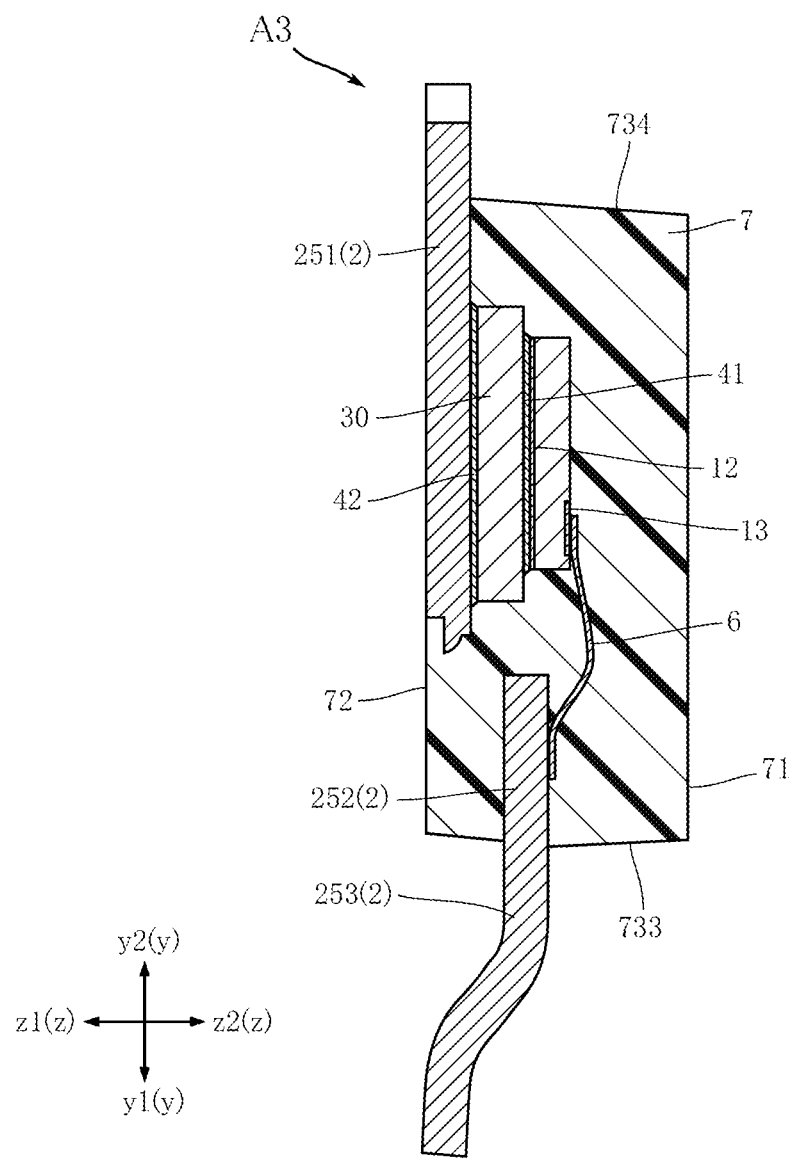
FIG. 17 is a sectional view taken along line XVII-XVII in FIG. 16.

FIGS. 16 and 17 show a semiconductor device A3 according to a third embodiment. FIG. 16 is a plan view of the semiconductor device A3, with the sealing member 7 indicated by imaginary lines (two-dot chain lines). FIG. 17 is a sectional view taken along line XVII-XVII in FIG. 16. The semiconductor device A3 is of a TO (Transistor Outline) package type.

The support member 2 is a lead frame. The support member 2 may be made of copper or copper alloy, for example. As shown in FIGS. 16 and 17, the support member 2 includes a die-pad 251, a plurality of inner leads 252 and a plurality of outer leads 253.

To the die-pad 251, a metal part 30 is bonded, and a semiconductor element 10 is mounted via the metal part 30. As shown in FIGS. 16 and 17, a portion of the surface of the die-pad 251 that faces in the z1 direction is exposed from the sealing member 7. Except this surface portion, the die-pad 251 is covered with the sealing member 7.

The inner leads 252 are spaced apart from the die-pad 251 and covered with the sealing member 7. One end of a connecting member 6 is bonded to each of the inner leads 252. The support member 2 of the semiconductor device A3 has two inner leads 252.

Each of the outer leads 253 is connected to one of the inner leads 252 and exposed from the sealing member 7. The outer leads 253 are the terminals of the semiconductor device A3 and may be bonded to a wiring board of electric appliances, for example.

The connecting members 6 are bonding wires. The connecting members 6 may not be bonding wires and may be metal leads or bonding ribbons. As shown in FIG. 16, the semiconductor device A3 has two connecting members 6. The number of the connecting members 6 is not particularly limited. As shown in FIG. 16, one of the two connecting members 6 is bonded to the third electrode 13 of the semiconductor element 10 and one of the two inner leads 252 to electrically connect these to each other. The other one of the two connecting members 6 is bonded to the first electrode 11 of the semiconductor element 10 and the other one of the inner leads 252 to electrically connect these to each other.

The advantages of the semiconductor device A3 having the above-described configuration are described below.

The semiconductor device A3 is provided with the semiconductor element 10, the support member 2 and the metal part 30. The semiconductor element 10 is bonded to the metal part 30 with the first bonding layer 41, and the metal part 30 is bonded to the support member 2 with the second bonding layer 42. The metal part 30 includes a first metal body 31 and a second metal body 32, and there exists a boundary (corresponding to the interface 33) between the first metal body 31 and the second metal body 32. The first metal body 31 is made of a first metal material while the second metal body 32 is made of a second metal material, and the coefficient of linear thermal expansion of the second metal material is smaller than that of the first metal material. Thus, as with semiconductor device A1, the semiconductor device A3 reduces the thermal stress exerted to the second bonding layer 42 adjoining the metal part 30, so that cohesive failure of the second bonding layer 42 is prevented. This leads to reduction of product failures such as poor joining or poor electrical conduction, so that the semiconductor device A3 has an improved reliability.

The semiconductor device A3 provides the same advantages as those of the semiconductor device A1 (or A2) because of the configuration that is the same or similar to the semiconductor device A1 (or A2).

The third embodiment shows the case where the semiconductor device A3 is of a TO package type. However, the present disclosure is not limited to this and can be applied to various types of semiconductor packages such as an SOP (Small Outline Package), a non-lead package or a BGA (Ball Grid Array).

The third embodiment shows the case where the support member 2 is a lead frame. However, the present disclosure is not limited to this, and the support member 2 may be an interposer, a printed circuit board, a DBC (Direct Bonded Copper) substrate or a DBA (Direct Bonded Aluminum) substrate, for example.

Figure 18:
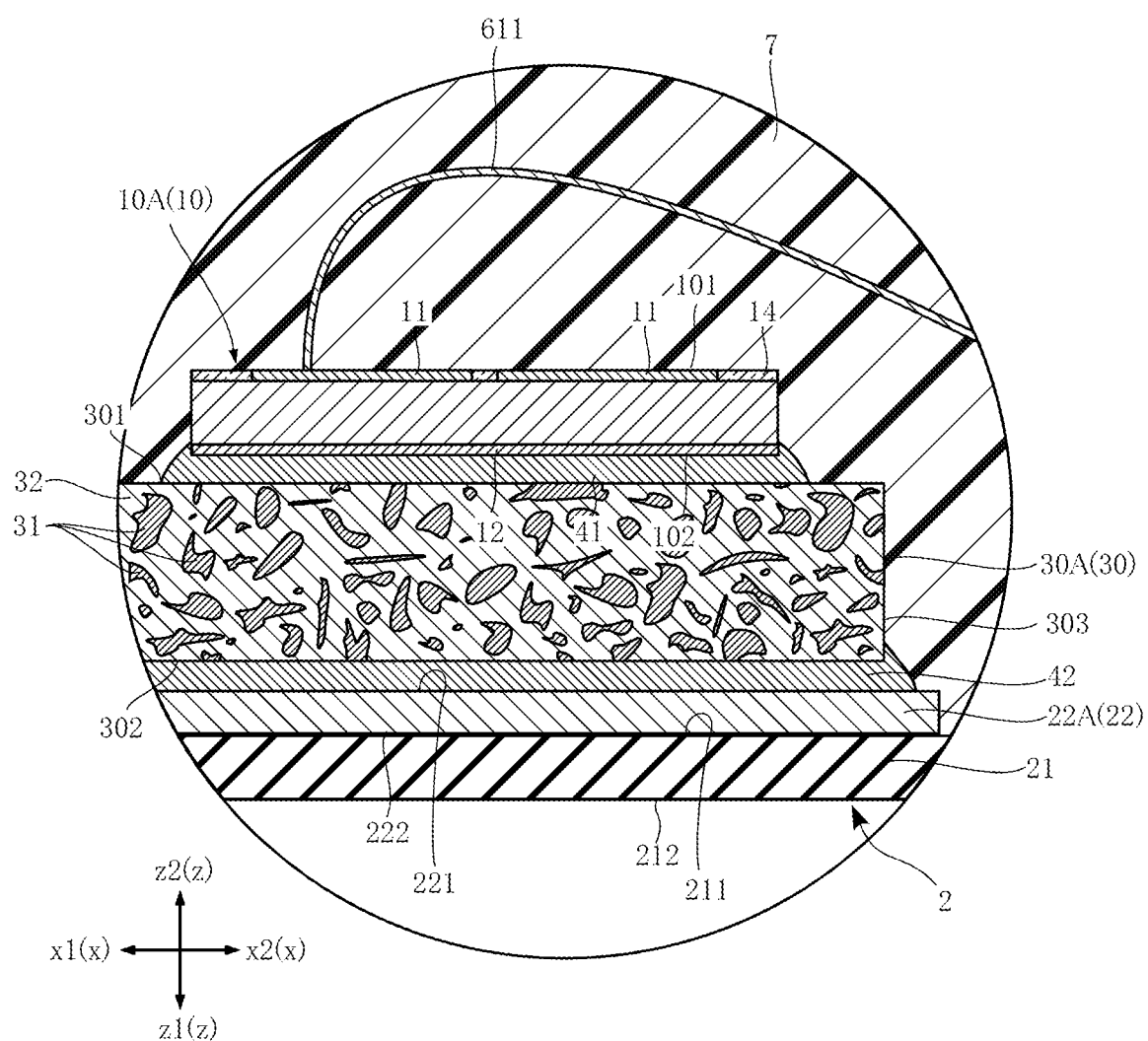
FIG. 18 is a partial sectional view showing a metal part according to a variation.

FIG. 18 shows a variation of a metal part 30. FIG. 18 is a sectional view of the metal part 30 according to the variation and corresponds to FIG. 13 of the semiconductor device A1. The metal part 30 shown in FIG. 18 can be used instead of each metal part 30 of the semiconductor devices A1-A3.

As shown in FIG. 18, the metal part 30 according to this variation has a second metal body 32 that is a porous body with a plurality of minute pores, which are filled with the first metal body 31. Thus, the metal part 30 according to this variation is a composite material and does not have a laminate structure. The second metal body 32 accounts for not less than 10% and not more than 40% (preferably 30%)

of each metal part 30. In the example shown in FIG. 18, all of the minute pores communicate with the outside of the second metal body 32 at portions not shown in FIG. 18 so that all of these pores are filled with the first metal body 31. Alternatively, all of the minute pores of the second metal body 32 may not be filled with the first metal body 31, and there may be pores filled with air and pores filled with the first metal body 31. For example, when the second metal body 32 has minute pores that do not communicate with the outside of the second metal body 32, such minute pores are not filled with the first metal body 31.

The metal part 30 according to this variation may be formed as follows. First, a second metal body 32, which is a porous body with a plurality of minute pores, is prepared. At this stage, the pores are filled with air. The minute pores account for not less than 10% and not more than 70% (preferably 30%) of the second metal body 32. The melting point of the first metal material is lower than that of the second metal material. Thus, it is possible to impregnate the pores of the second metal body 32 in a solid phase with the first metal body 31 in a liquid phase. In this manner, the metal part 30 in which minute holes of the second metal body 32 is filled with the first metal body 31 is obtained.

In the metal part 30 illustrated in FIG. 18 again, thermal strain of the metal part 30 due to the heat from the semiconductor element 10 occurs near the boundary between the first metal body 31 and the second metal body 32, which reduces the thermal stress near the boundary. Since the thermal stress due to the thermal expansion of the metal part 30 is reduced in this way, thermal stress exerted to the second bonding layer 42 adjoining the metal part 30 is reduced, which prevents cohesive failure of the second bonding layer 42. Thus, in the semiconductor device that employs the metal part 30 shown in FIG. 18 again, product failures such as poor joining or poor electrical conduction are reduced, which leads to an improved reliability.

The semiconductor device according to the present disclosure is not limited to the foregoing embodiments. The specific configuration of each part of the semiconductor device according to the present disclosure may be varied in design in many ways.

The semiconductor device according to the present disclosure include the embodiments of the following clauses.

Clause 1. A semiconductor device comprising:
a support member;
a metal part having a first obverse surface and a first reverse surface that are spaced apart from each other in a thickness direction, the first reverse surface facing the support member and being bonded to the support member,
a bonding layer that bonds the support member and the metal part,
a semiconductor element that faces the first obverse surface and is bonded to the metal part; and
a sealing member that covers the support member, the metal part, the bonding layer and the semiconductor element,
wherein the metal part includes a first metal body made of a first metal material and a second metal body made of a second metal material, with a boundary formed between the first metal body and the second metal body, and
the second metal material has a coefficient of linear thermal expansion that is smaller than a coefficient of linear thermal expansion of the first metal material.

Clause 2. The semiconductor device according to clause 1, wherein the first metal body includes a plurality of first metal layers,
the second metal body includes a plurality of second metal layers,
the metal part has a laminate structure in which the first metal layers and the second metal layer are alternately arranged in the thickness direction.

Clause 3. The semiconductor device according to clause 2, wherein the first metal layers include an outermost layer on a first obverse surface side and an outermost layer on a first reverse surface side of the metal part.

Clause 4. The semiconductor device according to clause 2 or 3, wherein a thickness of each of the first metal layers is larger than a thickness of each of the second metal layers.

Clause 5. The semiconductor device according to any one of clauses 2-4, wherein the metal part has a side surface located between the first obverse surface and the first reverse surface and connected to the first obverse surface and the first reverse surface, the metal part being formed with a crack extending from the side surface into the metal part.

Clause 6. The semiconductor device according to clause 5, wherein the crack is formed by partial detachment of one of the first metal layers and one of the second metal layers that adjoin each other.

Clause 7. The semiconductor device according to clause 5 or 6, wherein the crack is filled with the sealing member.

Clause 8. The semiconductor device according to any one of clauses 1-7, wherein the first metal material contains copper.

Clause 9. The semiconductor device according to any one of clauses 1-8, wherein the second metal material contains molybdenum.

Clause 10. The semiconductor device according to any one of clauses 1-9, wherein the support member includes an insulating substrate, and
the insulating substrate includes a second obverse surface and a second reverse surface that are spaced apart from each other in the thickness direction, the second obverse surface facing the metal part.

Clause 11. The semiconductor device according to clause 10, wherein the support member further includes a wiring layer,
the wiring layer includes a third obverse surface and a third reverse surface that are spaced apart from each other in the thickness direction, the third reverse surface being bonded to the insulating substrate, and
the metal part is bonded to the wiring layer, with the first reverse surface facing the third obverse surface.

Clause 12. The semiconductor device according to clause 10 or 11, wherein the coefficient of linear thermal expansion of the second metal material is closer to a coefficient of linear thermal expansion of the insulating substrate than is the coefficient of linear thermal expansion of the first metal material.

Clause 13. The semiconductor device according to any one of clauses 10-12, wherein the insulating substrate is made of a ceramic material.

Clause 14. The semiconductor device according to any one of clauses 10-13, wherein the second reverse surface of the insulating substrate is exposed from the sealing member.

Clause 15. The semiconductor device according to any one of clauses 1-14, wherein the bonding layer is solder.

Clause 16. The semiconductor device according to any one of clauses 1-15, wherein the semiconductor element is bonded to the metal part with a conductive bonding material.

Clause 17. The semiconductor device according to any one of clauses 1-16, wherein the metal part has a thickness larger than that of the support member.

Clause 18. The semiconductor device according to any one of clauses 1-17, wherein the thickness of the metal part is not less than 0.5 mm and not more than 5 mm.

The invention claimed is:

1. A semiconductor device comprising:
   a support member;
   a metal part having a first obverse surface and a first reverse surface that are spaced apart from each other in a thickness direction, the first reverse surface facing the support member and being bonded to the support member,
   a bonding layer that bonds the support member and the metal part,
   a semiconductor element that faces the first obverse surface and is bonded to the metal part; and
   a sealing member that covers the support member, the metal part, the bonding layer and the semiconductor element,
   wherein the metal part includes a first metal body made of a first metal material and a second metal body made of a second metal material, with a boundary formed between the first metal body and the second metal body,
   the second metal material has a coefficient of linear thermal expansion that is smaller than a coefficient of linear thermal expansion of the first metal material,
   the first metal body includes a plurality of first metal layers,
   the second metal body includes a plurality of second metal layers,
   the metal part has a side surface located between the first obverse surface and the first reverse surface and connected to the first obverse surface and the first reverse surface, the metal part being formed with a crack extending from the side surface into the metal part, and
   the crack is formed by partial detachment of one of the first metal layers and one of the second metal layers that are laminated with each other.

2. The semiconductor device according to claim 1, wherein
   the metal part has a laminate structure in which the first metal layers and the second metal layer are alternately arranged in the thickness direction.

3. The semiconductor device according to claim 2, wherein the first metal layers include an outermost layer on a first obverse surface side and an outermost layer on a first reverse surface side of the metal part.

4. The semiconductor device according to claim 2, wherein a thickness of each of the first metal layers is larger than a thickness of each of the second metal layers.

5. The semiconductor device according to claim 1, wherein the crack is filled with the sealing member.

6. The semiconductor device according to claim 1, wherein the first metal material contains copper.

7. The semiconductor device according to claim 1, wherein the second metal material contains molybdenum.

8. The semiconductor device according to claim 1, wherein the support member includes an insulating substrate,
   the insulating substrate includes a second obverse surface and a second reverse surface that are spaced apart from each other in the thickness direction, the second obverse surface facing the metal part, and
   the sealing member covers the second obverse surface.

9. The semiconductor device according to claim 8, wherein the support member further includes a wiring layer,
   the wiring layer includes a third obverse surface and a third reverse surface that are spaced apart from each other in the thickness direction, the third reverse surface being bonded to the insulating substrate, and
   the metal part is bonded to the wiring layer, with the first reverse surface facing the third obverse surface.

10. The semiconductor device according to claim 8, wherein the coefficient of linear thermal expansion of the second metal material is closer to a coefficient of linear thermal expansion of the insulating substrate than is the coefficient of linear thermal expansion of the first metal material.

11. The semiconductor device according to claim 8, wherein the insulating substrate is made of a ceramic material.

12. The semiconductor device according to claim 8, wherein the second reverse surface of the insulating substrate is exposed from the sealing member.

13. The semiconductor device according to claim 1, wherein the bonding layer is solder.

14. The semiconductor device according to claim 1, wherein the semiconductor element is bonded to the metal part with a conductive bonding material.

15. The semiconductor device according to claim 1, wherein the metal part has a thickness larger than that of the support member.

16. The semiconductor device according to claim 1, wherein the thickness of the metal part is not less than 0.5 mm and not more than 5 mm.

* * * * *